United States Patent
Hsu et al.

(10) Patent No.: US 10,511,140 B2
(45) Date of Patent: Dec. 17, 2019

(54) LIGHT-EMITTING DEVICE

(71) Applicant: EPISTAR CORPORATION, Hsinchu (TW)

(72) Inventors: Tzu-Chieh Hsu, Hsinchu (TW); Yi-Wen Huang, Hsinchu (TW); Yi-Hung Lin, Hsinchu (TW); Chih-Chiang Lu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 16/106,458

(22) Filed: Aug. 21, 2018

(65) Prior Publication Data

US 2018/0358780 A1 Dec. 13, 2018

Related U.S. Application Data

(63) Continuation of application No. 15/794,756, filed on Oct. 26, 2017, now Pat. No. 10,090,643, which is a
(Continued)

(51) Int. Cl.
| | | |
|---|---|---|
| *H01S 5/187* | (2006.01) | |
| *H01S 5/042* | (2006.01) | |
| *H01S 5/183* | (2006.01) | |
| *H01S 5/22* | (2006.01) | |
| *H01S 5/343* | (2006.01) | |
| H01S 5/022 | (2006.01) | |
| H01S 5/026 | (2006.01) | |

(Continued)

(52) U.S. Cl.
CPC .......... *H01S 5/0425* (2013.01); *H01S 5/0421* (2013.01); *H01S 5/187* (2013.01); *H01S 5/18322* (2013.01); *H01S 5/18344* (2013.01); *H01S 5/18394* (2013.01); *H01S 5/2213* (2013.01); *H01S 5/2214* (2013.01); *H01S 5/2216* (2013.01); *H01S 5/343* (2013.01); H01S 5/026 (2013.01); H01S 5/0283 (2013.01); H01S 5/0286 (2013.01); H01S 5/02276 (2013.01); H01S 5/1835 (2013.01);
(Continued)

(58) Field of Classification Search
CPC .. H01S 5/0425; H01S 5/18394; H01S 5/2216; H01S 5/2214; H01S 5/343; H01S 5/18344; H01S 5/0421; H01S 5/18322; H01S 5/187; H01S 5/2213; H01S 5/423; H01S 5/1835; H01S 5/18308; H01S 5/0283; H01S 5/0286; H01S 5/18391; H01S 2301/18; H01S 5/02276; H01S 5/026

See application file for complete search history.

(56) References Cited

U.S. PATENT DOCUMENTS

| | | | |
|---|---|---|---|
| 3,835,415 A | 9/1974 | Rutz et al. | |
| 5,008,889 A * | 4/1991 | Wilson | ............... H01L 33/0045 257/E33.054 |

(Continued)

*Primary Examiner* — Yuanda Zhang
(74) *Attorney, Agent, or Firm* — Patterson + Sheridan, LLP

(57) ABSTRACT

A light-emitting device is provided. The light-emitting device comprises: a substrate; and multiple radiation emitting regions arranged on the substrate, and comprising: a first radiation emitting region capable of emitting coherent light and emits a coherent light when driven by a first current; a second radiation emitting region capable of emitting coherent light and emits an incoherent light when driven by the first current, wherein each of the first radiation emitting region and the second emitting region comprises epitaxial structure comprising a first DBR stack, a light-emitting structure, and a second DBR stack.

20 Claims, 23 Drawing Sheets

Related U.S. Application Data continuation of application No. 15/062,995, filed on Mar. 7, 2016, now Pat. No. 9,837,792.

(51) Int. Cl.
 *H01S 5/028* (2006.01)
 *H01S 5/42* (2006.01)

(52) U.S. Cl.
 CPC ....... *H01S 5/18308* (2013.01); *H01S 5/18391* (2013.01); *H01S 5/423* (2013.01); *H01S 2301/18* (2013.01)

(56) References Cited

U.S. PATENT DOCUMENTS

| | | |
|---|---|---|
| 6,403,983 B1 | 6/2002 | Mizuno |
| 7,366,218 B2 | 4/2008 | Mukoyama et al. |
| 2005/0041715 A1* | 2/2005 | Kim ................. B82Y 10/00 372/50.21 |
| 2005/0195874 A1* | 9/2005 | Forrest ................ H01S 3/168 372/39 |
| 2005/0207461 A1* | 9/2005 | Philippens ........... H01L 27/15 372/43.01 |
| 2005/0286597 A1* | 12/2005 | Mukoyama ......... H01S 5/02288 372/50.23 |
| 2006/0209911 A1* | 9/2006 | Takabayashi ....... H01S 5/06256 372/20 |
| 2008/0019410 A1 | 1/2008 | Onishi |
| 2009/0245312 A1 | 10/2009 | Kageyama et al. |
| 2009/0310637 A1* | 12/2009 | Kageyama .......... H01S 5/18311 372/43.01 |
| 2010/0288997 A1 | 11/2010 | Fukamachi et al. |
| 2011/0188530 A1* | 8/2011 | Lell .................. H01S 5/0078 372/49.01 |
| 2015/0255954 A1* | 9/2015 | Feng ................ H01S 5/06203 372/50.11 |

* cited by examiner

LIGHT-EMITTING DEVICE

REFERENCE TO RELATED APPLICATION

This application is a Continuation of a previously filed U.S. patent application Ser. No. 15/794,756, filed on Oct. 26, 2017 which is a continuation application of a previously filed U.S. patent application Ser. No. 15/062,995 filed on Mar. 7, 2016, entitled as "LIGHT-EMITTING DEVICE", both of which are incorporated by reference.

TECHNICAL FIELD

The disclosure relates to a light-emitting device, and particularly to a light-emitting device having laser and light-emitting diode (LED) characteristics.

DESCRIPTION OF BACKGROUND ART

Light-emitting diodes (LEDs) are widely used as solid-state light sources. Compared to conventional incandescent light lamps or fluorescent light tubes, LEDs have advantages such as lower power consumption and longer lifetime, and therefore LEDs gradually replace the conventional light sources and are applied to various fields such as traffic lights, back light modules, street lighting, and biomedical device.

FIG. 24 is a cross-sectional diagram showing a conventional vertical cavity surface emitting laser (VCSEL). A vertical cavity surface emitting laser (VCSEL) is capable of emitting coherent light in a direction perpendicular to an active region. VCSEL comprises a structure having a substrate 300, a pair of DBR stacks 200,210 on the substrate 300 interposing an active region 230 where electrons and holes combine to generate light. A first electrode 240 and a second electrode 250 are provided for an electrical current to be injected into the active region to generate light, and the light is exited from an aperture on an upper surface of the VCSEL.

The vertical cavity surface emitting laser may have an undercut aperture 260 in one of the DBR stacks 210. The undercut aperture 260 is formed by selectively etched away a periphery part of one of layers in the DBR stack 210, and thus an air gap having relatively low conductivity compared to the conductivity of the other layers is formed in the DBR stack 210.

SUMMARY OF THE INVENTION

The present disclosure provides a light-emitting device. The light-emitting device comprising: a substrate; and multiple radiation emitting regions arranged on the substrate, and comprising: a first radiation emitting region capable of emitting coherent light and emits a coherent light when driven by a first current; a second radiation emitting region capable of emitting coherent light and emits an incoherent light when driven by the first current, wherein each of the first radiation emitting region and the second emitting region comprises epitaxial structure comprising a first DBR stack, a light-emitting structure, and a second DBR stack.

BRIEF DESCRIPTION OF THE DRAWINGS

The foregoing aspects and many of the attendant advantages of this disclosure will become more readily appreciated as the same becomes better understood by reference to the following detailed description, when taken in conjunction with the accompanying drawings, wherein.

DETAILED DESCRIPTION OF PREFERRED EMBODIMENTS

Figure 1A:
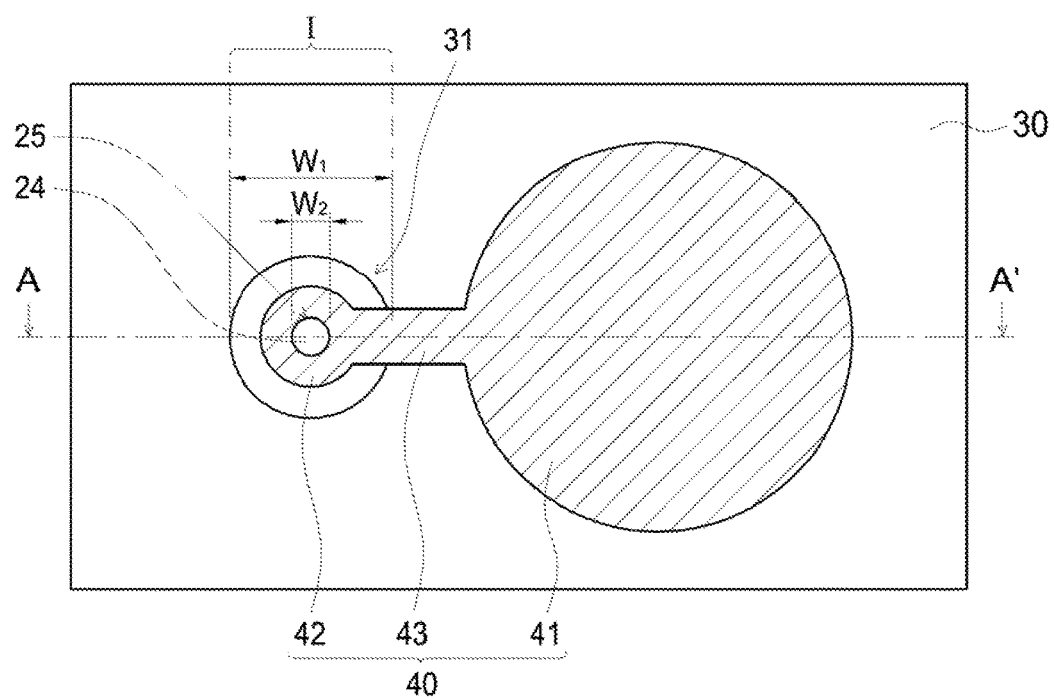
FIG. 1A is a top view of the first embodiment of the light-emitting device in accordance with the present disclosure.

Exemplary embodiments of the present disclosure will be described in detail with reference to the accompanying drawings hereafter. The following embodiments are given by way of illustration to help those skilled in the art fully understand the spirit of the present disclosure. Hence, it should be noted that the present disclosure is not limited to the embodiments herein and can be realized by various forms. Further, the drawings are not precisely scaled and components may be exaggerated in view of width, height, length, etc. Herein, the similar or identical reference numerals will denote the similar or identical components throughout the drawings.

In the present disclosure, if not specifically mention, the general expression of AlGaAs means $Al_xGa_{(1-x)}As$, wherein $0 \leq x \leq 1$; the general expression of AlInP means $Al_xIn_{(1-x)}P$, wherein $0 \leq x \leq 1$; the general expression of AlGaInP means $(Al_yGa_{(1-y)})_{1-x}In_xP$, wherein $0 \leq x \leq 1$, $0 \leq y \leq 1$; the general expression of AlGaN means $Al_xGa_{(1-x)}N$, wherein $0 \leq x \leq 1$; the general expression of AlAsSb means $AlAs_{(1-x)}Sb_x$ wherein $0 \leq x \leq 1$ and the general expression of InGaP means $In_xGa_{1-x}P$, wherein $0 \leq x \leq 1$. The content of the element can be adjusted for different purposes, such as, but not limited to, adjusting the energy gap or adjusting the peak wavelength or the dominant wavelength.

Figure 1B:
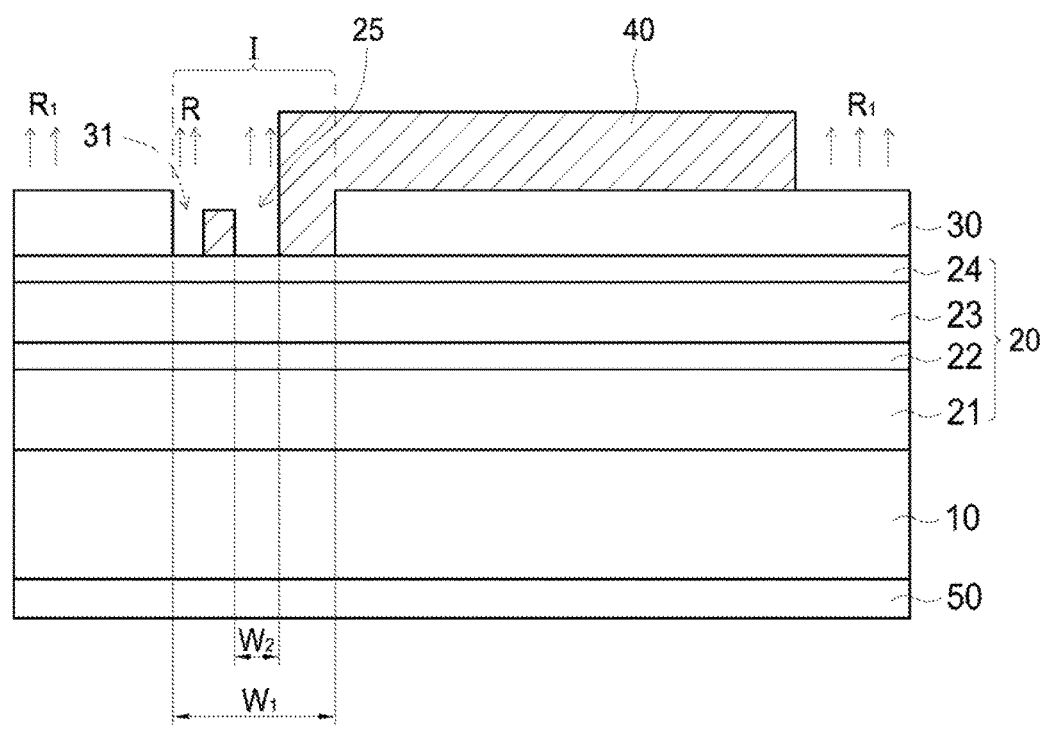
FIG. 1B is a cross-sectional diagram along an A-A' line showing the first embodiment of the light-emitting device shown in FIG. 1A.

FIG. 1A is a top view of the first embodiment of the light-emitting device in accordance with the present disclosure; FIG. 1B is a cross-sectional diagram along an A-A' line showing the first embodiment of the light-emitting device shown in FIG. 1A. In the present embodiment, the light-emitting device comprises a substrate 10, an epitaxial structure 20 on the substrate 10, a current blocking layer 30, a first electrode 40, and a second electrode 50. The epitaxial structure 20 comprises a first DBR stack 21, a light-emitting stack 22 and a second DBR stack 23 and a contact layer 24 in sequence. The conductivity type of the first DBR stack 21 is different from that of the second DBR stack 23. In the present embodiment, the first DBR stack 21 is n-type, and the second DBR stack 23 is p-type. The current blocking layer 30 is between the contact layer 24 and the first electrode 40. A first opening 31 is formed in the current blocking layer 30 to expose the contact layer 24, and the first opening 31 has a first maximum width $w_1$. A part of the first electrode 40 fills in the first opening 31 and directly contacts the contact layer 24. A second opening 25 is formed in the first electrode 40 to expose the contact layer 24 and has a second maximum width $w_2$ less than the first maximum width $w_1$. The second electrode 50 is on the side of the substrate 10 opposite to the epitaxial structure 20. The light-emitting device is capable of emitting emit a radiation R having a peak wavelength between 600 nm and 1600 nm, and preferably between 830 nm and 1000 nm.

As shown in FIG. 1B, in the present embodiment, the width of the substrate 10, the width of the epitaxial structure 20, and the width of the current blocking layer 30 are substantially the same. In the present embodiment, the first opening 31 has a shape of circle, and the first maximum width $w_1$ is the diameter of the circle. The shape of the first opening 31 is not limited to the present embodiment. The shape of the first opening 31 can be of ellipse, rectangular, square, rhombus or any other shape. The first maximum width $w_1$ is, but not limited to, between 20 μm and 50 μm. The current blocking layer 30 comprises insulating material comprising aluminum oxide ($Al_xO_y$), silicon oxide ($SiO_x$), silicon oxynitride ($SiO_xN_y$), silicon nitride ($Si_xN_y$), epoxy, polyimide, perfluorocyclobutane, benzocyclobutene (BCB) or silicone. Preferably, the current blocking layer 30 is substantially transparent to the radiation emitted by the light-emitting stack 22. The current blocking layer 30 has a thickness greater than 100 nm, and preferably less than 2 μm, and more preferably, close or equal to $n\lambda/4$, wherein $\lambda$ is the peak wavelength of the radiation emitted from the light-emitting stack 22, and n is an odd positive integer.

In the present embodiment, the second opening 25 has a shape of circle, and the second maximum width $w_2$ is the diameter of the circle. The shape of the second opening 25 is not limited to the present embodiment. The shape of the second opening 25 can be of ellipse, rectangular, square, rhombus or any other shape. Preferably, the shape of the second opening 25 is substantially the same as the shape of the first opening 31. Preferably, the first opening 31 and the second opening 25 are with a common center. More preferably, the first opening 31 and the second opening 25 are substantially concentric circles.

As shown in FIGS. 1A and 1B, the first electrode 40 is a contiguous layer and comprises a bonding portion 41 for bonding a wire, a current injection portion 42 for injecting a current through the epitaxial structure 20, and a bridge portion 43 connecting the bonding portion 41 and the current injection portion 42. The bonding portion 41 is on the current blocking layer 30. The current injection portion 42 fills in the first opening 31 and contacts the contact layer 24. In one embodiment, the current injection portion 42 is in a form of ring such that the second opening 25 is formed within the current injection portion 42. Specifically, in the present embodiment, the current injection portion 42 is separated from a side wall of the current blocking layer 30 and thus a gap is formed between the current injection portion 42 and the side wall of the current blocking layer 30, wherein the gap exposes a part of the epitaxial structure 20 as shown in FIG. 1A and FIG. 1B. The first electrode 40 of the present embodiment covers less than 50% of the surface area of the current blocking layer 30. The current blocking layer 30 between the bridge portion 43 and the epitaxial structure 20 and between the bonding portion 41 and the epitaxial structure 20 is for preventing a current from directly flowing through the epitaxial structure 20 from the bonding portion 41 and the bridge portion 43.

Figure 24:
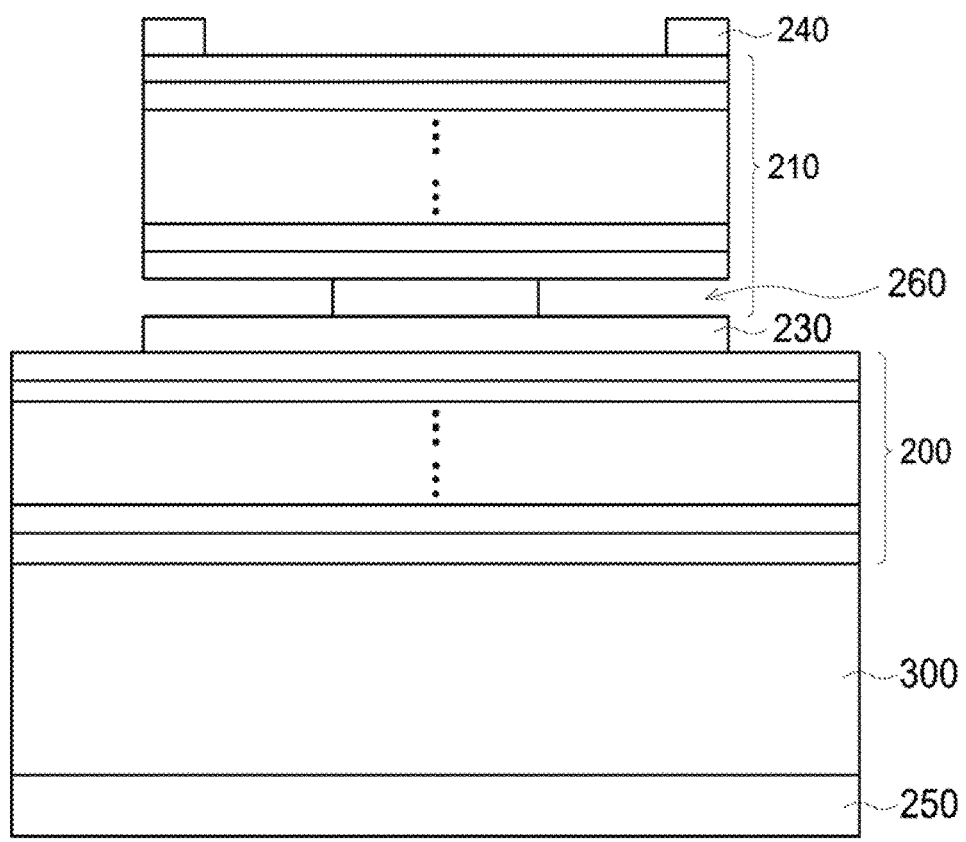
FIG. 24 is a cross-sectional diagram showing a conventional vertical cavity surface emitting laser (VCSEL).

In the present embodiment, the light-emitting device is devoid of a highly resistive structure in the second DBR stack 23, wherein the highly resistive structure is one layer in the second DBR stack 23 directly under the first electrode 40 and thus covered by the first electrode 40 and has relatively low conductivity compared to conductivity of the other layers in the second DBR stack 23 directly under and thus covered by the first electrode 40. Specifically, the highly resistive structure is embodied like an oxidized layer, an ion implanted layer or an undercut aperture as shown in FIG. 24. More preferably, the light-emitting device is devoid of an oxidized layer, an ion implanted layer and an undercut aperture in the second DBR stack 23 directly under the current blocking layer 30 and/or directly under the first electrode 40. That is, the conductivity of the portion of the second DBR stack 23 directly under the first opening 31 as a whole is substantially the same as the conductivity of the portion of the second DBR stack 23 covered by the current blocking layer 30 as a whole. Preferably, the second DBR stack 23 consists essentially of a Group III-V semiconductor material, such as AlGaAs. The second DBR stack 23 is devoid of any oxides, such as aluminum oxide, that are intentionally formed, wherein aluminum oxide has an empirical formula $Al_aO_b$, wherein a and b are natural numbers excluding 0. Furthermore, the second DBR stack 23 is devoid of any conductivity reducing ions that are intentionally formed for reducing the conductivity of a part of the second DBR stack 23 more than 3 orders of magnitude, and preferably, more than 5 orders of magnitude, compared to the conductivity of the other part of the second DBR stack 23, which is more conductive. The conductivity reducing ions comprise Ar ion, He ion, or H ion. The second DBR stack 23 may comprises inevitable ions existing in the environment, however, since the inevitable ions does not substantially change the conductivity of the second DBR stack 23, for example, the inevitable ions does not reduce conductivity more than 1 order of magnitude compared to the conductivity of the more conductive part of the second DBR stack 23, the inevitable ions should not be taken into consideration in the present disclosure. In one embodiment, because the light-emitting device is devoid of an undercut aperture in the second DBR stack 23 as shown in FIG. 24, each layer of the second DBR stack 23 consists essentially of a Group III-V semiconductor material and is without air gap in any layer of the second DBR stack 23.

When a current flows into the epitaxial structure 20, because the current injection portion 42 in the first opening 31 directly contacts the contact layer 24 of the epitaxial structure 20, and because the bonding portion 41 and the bridge portion 43 are separated and insulated from the epitaxial structure 20 by the current blocking layer 30, the current mostly flows through the portion of the epitaxial structure 20 not covered by the current blocking layer 30 and directly contacting the current injection portion 42. That is, the current density of the portion of the second DBR stack 23 directly under the current blocking layer 30 is much lower than the current density of the portion of the second DBR stack 23 not covered by the current blocking layer 30 when the current flows into the epitaxial structure 20. As a result, the portion of the epitaxial structure 20 directly contacts the current injection portion 42 and substantially directly under the first opening 31 functions as a radiation emitting region for generating the radiation R. The radiation R escapes out of the light-emitting device through the first opening 31. Specifically, the topmost layer of the epitaxial structure 20, i.e. the contact layer 24 in the present embodiment, is the first layer in the epitaxial structure 20 to conduct a confined current in the light-emitting device.

Figure 2:
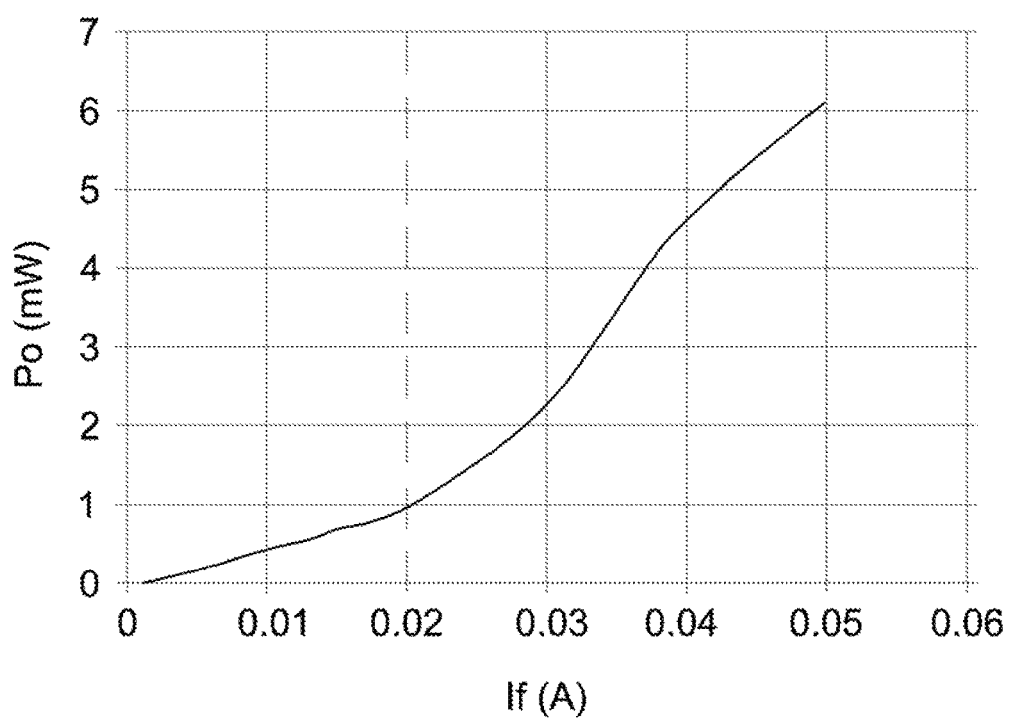
FIG. 2 shows a relationship curve of optical output power vs. forward current of the first embodiment of the light-emitting device.

FIG. 2 shows a relationship curve of optical output power vs. forward current of the first embodiment of the light-emitting device. In the present embodiment, the light-emitting device has a forward voltage $V_f$, a lasing threshold current $I_{th}$ and a saturation current $I_{sat}$. The forward voltage $V_f$ is at which the light-emitting device starts to conduct a significant forward current, for example, in the present embodiment, 5 mA. The lasing threshold current $I_{th}$ is the minimum current at which the radiation emitting from the radiation emitting region I of the light-emitting device is dominated by stimulated emission rather than by spontaneous emission, and therefore the radiation becomes coherent. The saturation current $I_{sat}$ is a current at which the radiation output is no longer increased with increasing forward current. The radiation emitted from the radiation emitting region I of the light-emitting device of the present disclosure is an incoherent light at an operating voltage $V_{op}$ greater than a forward voltage $V_f$ of the light-emitting device and at a forward current less than the lasing threshold current $I_{th}$. Preferably, the incoherent light has a far-field angle of greater than 60 degrees when the light-emitting device operates at an operating voltage greater than a forward voltage $V_f$ of the light-emitting device and an operating current less than the lasing threshold current $I_{th}$. The radiation R emitted from the radiation emitting region I of the light-emitting device is a coherent light having a far-field angle of less than 15 degrees when the light-emitting device operates at a forward current greater than the lasing threshold current $I_{th}$ and less than the saturation current $I_{sat}$. Specifically, when the light-emitting device operates at a forward current substantially equal to the lasing threshold current $I_{th}$, the part of the epitaxial structure 20 other than the radiation emitting region I and other than the part of the epitaxial structure 20 covered by the first electrode 40 emits an incoherent light $R_1$ since having current density far less than that of the radiation emitting region I. The bonding portion 41 and the bridge portion 43 shields the radiation emitted from the epitaxial structure 20.

In the present embodiment, the lasing threshold current $I_{th}$ is about 20 mA. The lasing threshold current $I_{th}$, the saturation current $I_{sat}$ and a difference between the lasing threshold current $I_{th}$ and the saturation current $I_{sat}$ can be adjusted by the first maximum width $w_1$ of the first opening 31 for different applications. For example, if a higher lasing threshold current $I_{th}$, a higher saturation current $I_{sat}$ and a higher difference between the lasing threshold current $I_{th}$ and the saturation current $I_{sat}$ are needed, the first maximum width $w_1$ can be larger. Specifically, the lasing threshold current $I_{th}$ and the first maximum width $w_1$ fulfill the following equation:

$$0.4_{1(\mu m)} - 7 \leq I_{th(mA)} \leq 0.4 w_{1(\mu m)} + 7$$

Table 1 shows far-field angles of the radiation of the light-emitting device at different forward currents. The far-field angle of the present disclosure is determined as the divergent angle at full width at half maximum intensity to specify the beam divergence.

TABLE 1

| forward current (mA) | Far-field angle |
| --- | --- |
| 20 | 65.6° |
| 23 | 5.6° |
| 25 | 5.8° |
| 30 | 6.5° |
| 40 | 7.9° |

From Table 1, when a forward current is higher than the lasing threshold current $I_{th}$ and lower than the saturation current $I_{sat}$, the far-field angle of the radiation is less than 15 degrees, and preferably, between 5 and 15 degrees, and more preferably, between 5 and 13 degrees.

In the present disclosure, although the light-emitting device is devoid of a highly resistive structure comprising an oxidized layer and an ion implanted layer in the second DBR stack 23, by comprising the current blocking layer 30 and the first electrode 40, which results in the topmost layer of the epitaxial structure 20 being the first layer of the epitaxial structure 20 to conduct a confined current in the light-emitting device, the light-emitting device has a far-field angle smaller than 15 degrees when a forward current is between the lasing threshold current $I_{th}$ and the saturation current $I_{sat}$. Besides, a conventional light-emitting device comprising a highly resistive structure, e.g. an oxidized layer, in the second DBR stack 23 has a wide far-field angle under normal operation, especially operating under a higher forward current. However, the light-emitting device has a far-field angle smaller than 15 degrees when a forward current is in a range between the lasing threshold current $I_{th}$ and the saturation current $I_{sat}$. The light-emitting device is applicable to sensors such as proximity, night vision systems or oxymeter.

Figure 3A:
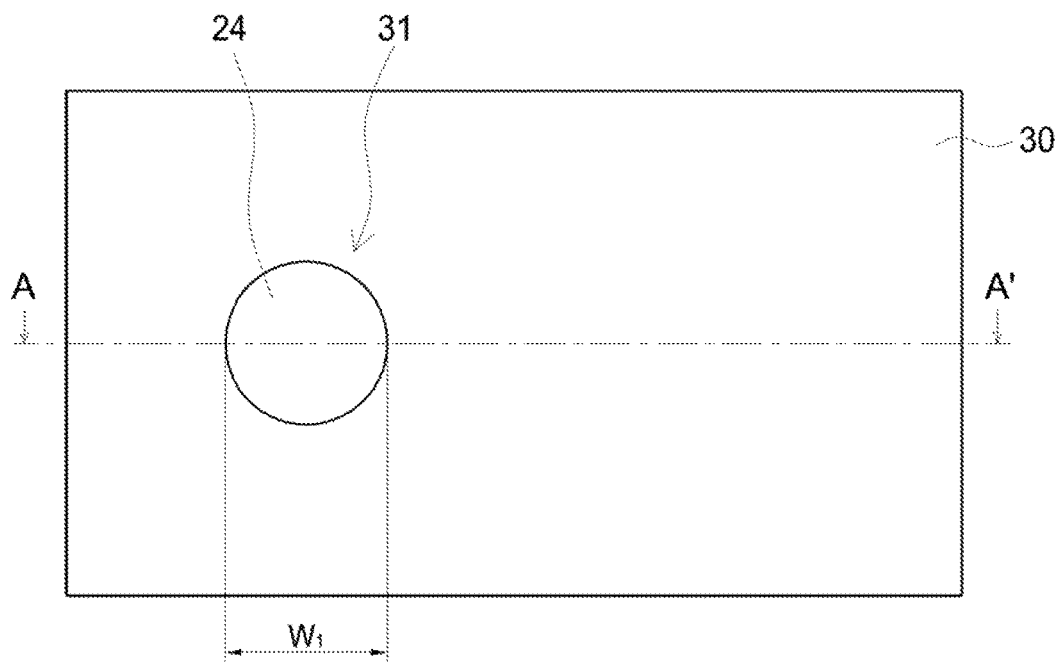
FIG. 3A through FIG. 4B demonstrate the method for manufacturing the light-emitting device shown in FIG. 1A and FIG. 1B.
Figure 3B:
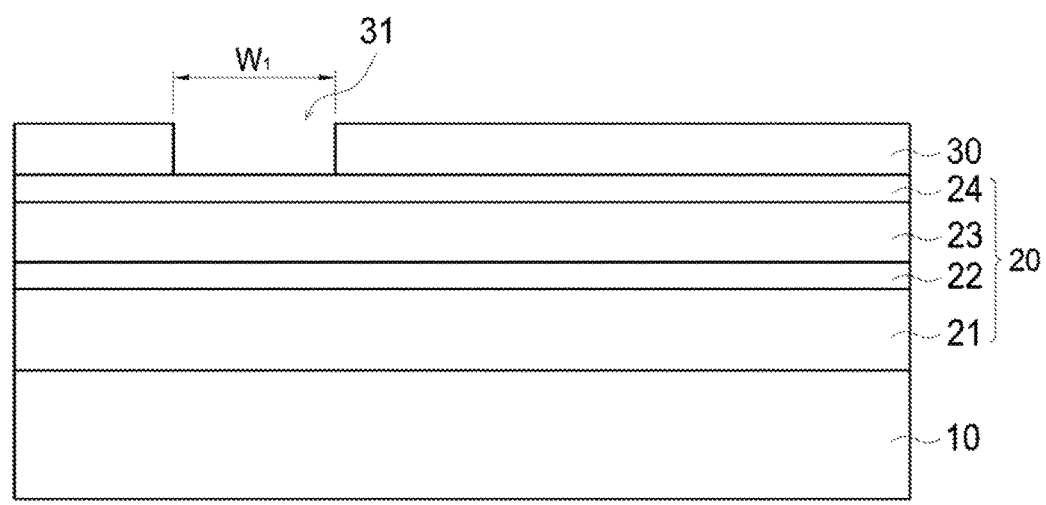
Figure 4A:
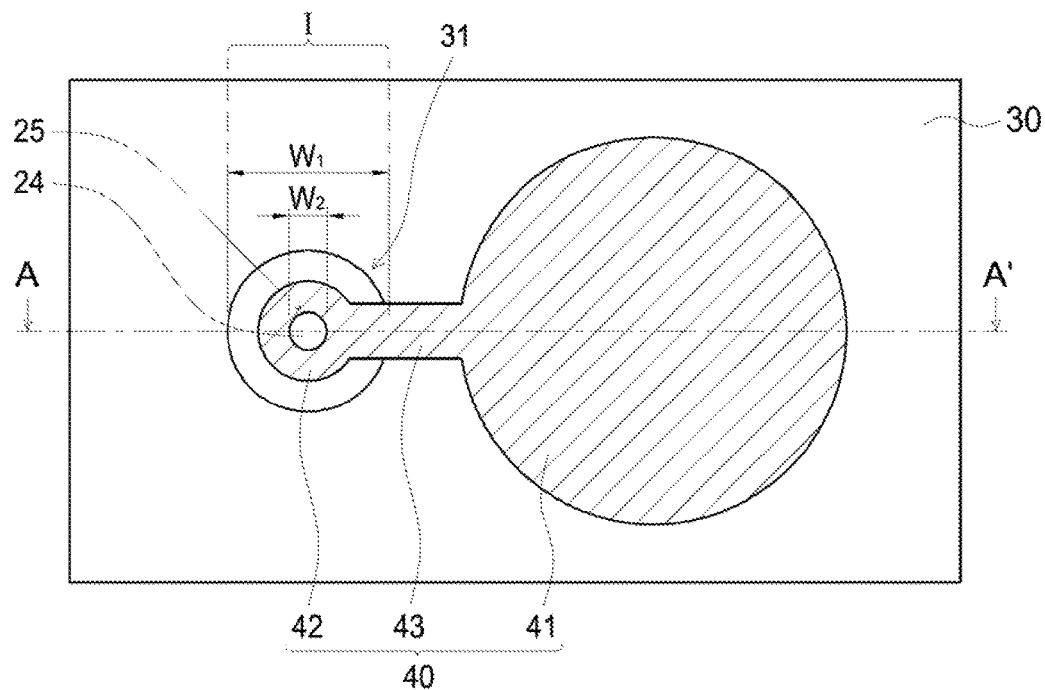
Figure 4B:
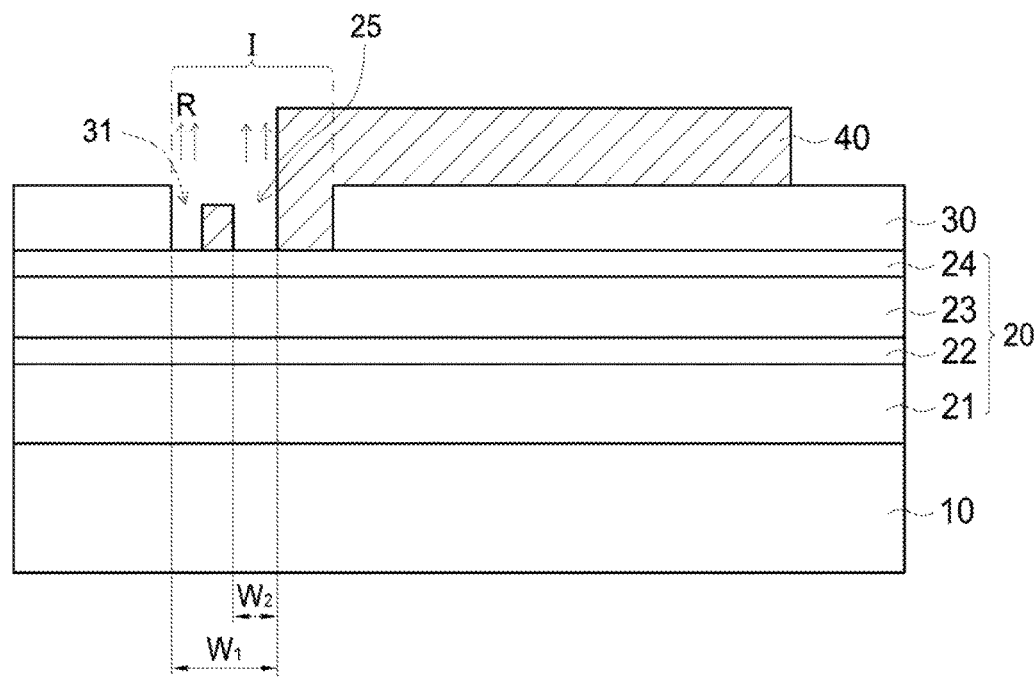

FIG. 3A through FIG. 4B demonstrate the method for manufacturing the light-emitting device shown in FIG. 1A and FIG. 1B; FIG. 3B is a cross-sectional diagram along an A-A' line shown in FIG. 3A; FIG. 4B is a cross-sectional diagram along an A-A' line shown in FIG. 4A. The method comprises the steps of:

a. referring to FIG. 3A and FIG. 3B, providing a substrate 10;
b. forming an epitaxial structure 20 on the substrate 10 by epitaxial growth;
c. forming a current blocking layer 30 on the epitaxial structure 20 by any suitable method, such as sputtering or evaporation;
d. patterning the current blocking layer 30 by a lithographic mask to form a first opening 31 to expose a part of the epitaxial structure 20 by any suitable method;
e. forming a metal layer (nor shown) on the current blocking layer 30 and covering the first opening 31 as shown in FIG. 4A and FIG. 4B;
f. patterning the metal layer by a lithographic mask to form a first electrode 40, wherein the first electrode 40 comprises a current injection portion 42, a bonding portion 41 and a bridge portion 43 connecting the bonding portion 41 and the current injection portion 42, wherein the bonding portion 41 and the bridge portion 43 are on the current blocking layer 30, and the current injection portion 42 fills in the first opening 31, a second opening 25 is formed in the current injection portion 42 to expose the epitaxial structure 20;
g. forming a second electrode 50 on the side of the substrate 10 opposite to the epitaxial structure 20 by any suitable method; and
h. dicing the structure formed at step g to obtain an individual finished light-emitting device shown in FIG. 1A and FIG. 1B.

The method of the present disclosure is devoid of a step of reducing conductivity in a region in the second DBR stack 23, such as an oxidation step to oxidize at least one layer in the second DBR stack 23, an ion implantation step to implant at least one conductivity reducing ion into at least one layer in the second DBR stack 23 and/or an etching step to selectively etch away a periphery part of at least one layer in the second DBR stack 23 to form an undercut aperture such that the conductivity in the oxidized region, the ion implanted region, or the undercut aperture as shown in FIG. 24 is lower than that of the other region of the second DBR stack 23. The oxidation step, the ion implantation step and the step of etching one of the layers in the second DBR stack 23 are for turning a part of the second DBR stack 23 directly under the first electrode 40 into a substantially insulated region so as toから a highly resistive structure in the second DBR stack 23. The method of the present disclosure uses no more than 4 different lithographic masks for patterning process. In the present embodiment, the method uses only two different lithographic masks for patterning process. As a result, the method for manufacturing the light-emitting device is simple and cost effective.

Figure 5A:
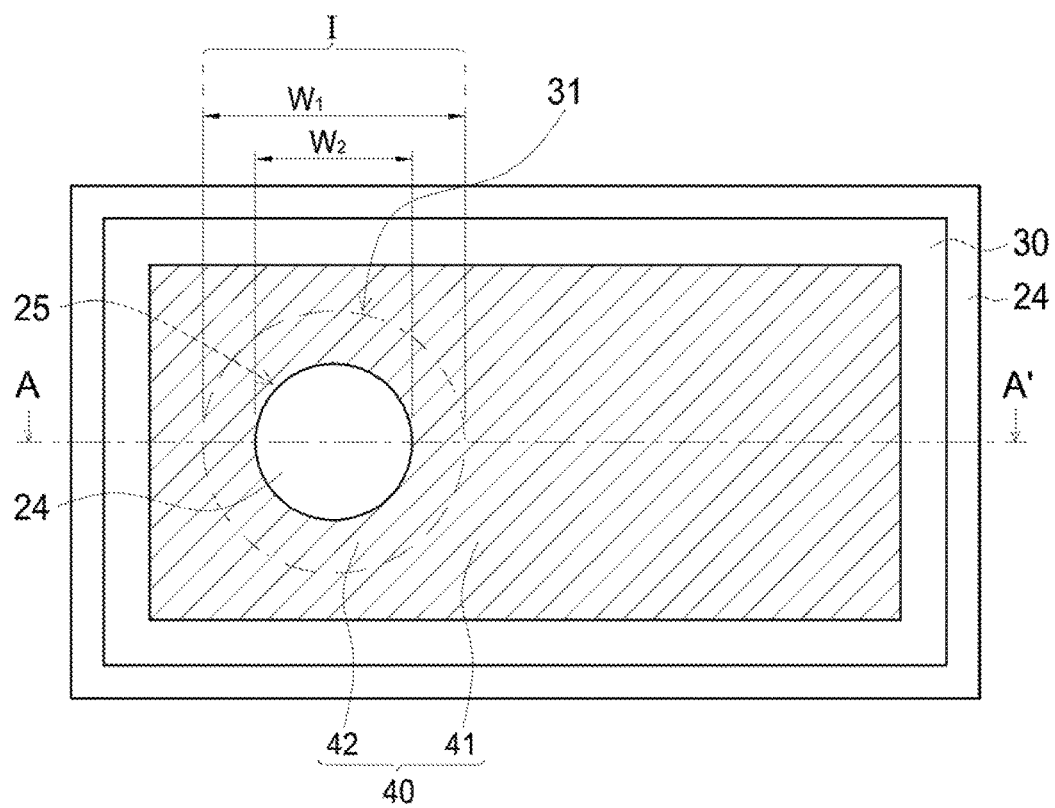
FIG. 5A is a top view of the second embodiment of the light-emitting device in accordance with the present disclosure.
Figure 5B:
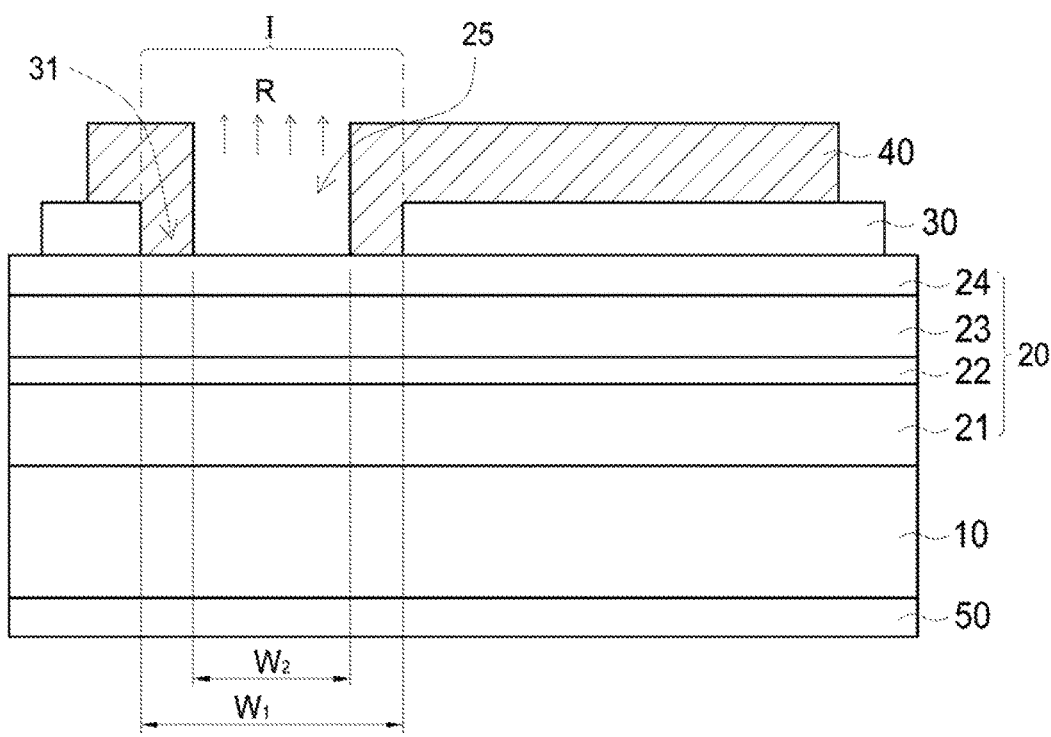
FIG. 5B is a cross-sectional diagram along an A-A' line of the light-emitting device shown in FIG. 5A.

FIG. 5A is a top view of the second embodiment of the light-emitting device in accordance with the present disclosure; FIG. 5B is a cross-sectional diagram along an A-A' line of the light-emitting device shown in FIG. 5A. The same reference number given or appeared in different paragraphs or figures along the specification should has the same or equivalent structure, material, material composition, the manufacturing process thereof while it is once defined anywhere of the disclosure except it is specifically described differently. The light-emitting device in accordance with the second embodiment of the present disclosure comprises substantially the same structure as the first embodiment, and the difference is that the width of the current blocking layer 30 is less than the width of the epitaxial structure 20. As a result, a periphery part of the epitaxial structure 20 is exposed from the current blocking layer 30 from a top view of the light-emitting device. Besides, the first electrode 40 has a shape different from that of the first embodiment. Specifically, the first electrode 40 covers the whole side wall of the current blocking layer 30 enclosing the first opening 31 and thus only exposes the contact layer 24 directly under the second opening 25. As a result, the epitaxial structure 20 directly contacts the current injection portion 42 and substantially directly under the first opening 31 functions as a radiation emitting region I, and the radiation R escapes out of the surface of the light-emitting device mainly through the second opening 25. Furthermore, the first electrode 40 covers more than 50% of the surface area of the current blocking layer 30, and the first electrode 40 has a shape substantially the same as the shape of the current blocking layer 30. Preferably, the first electrode 40 covers more than 80% of the surface area of the current blocking layer 30, and more preferably, more than 90% of the surface area of the current blocking layer 30. A part of the first electrode 40 away from the second opening 25 is for bonding a wire. Because the first electrode 40 covers a large surface area of the current blocking layer 30 and covers the whole side wall of the current blocking layer 30 enclosing the first opening 31, when a forward current is higher than the lasing threshold current $I_{th}$ of the light-emitting device, an incoherent light emitted from the light-emitting stack 22 directly under most part of the first electrode 40 is shielded by the first electrode 40 while a coherent light emitted from the light-emitting stack 22 escapes from the second opening 25. The method for manufacturing the light-emitting device as shown in FIG. 5A and FIG. 5B is substantially the same as the method for manufacturing the light-emitting device as shown in FIG. 1A and FIG. 1B except that the lithographic mask for patterning the metal layer is different and therefore, the pattern of the first electrode 40 in the second embodiment is different from the pattern of the first electrode 40 in the first embodiment.

Figure 6:
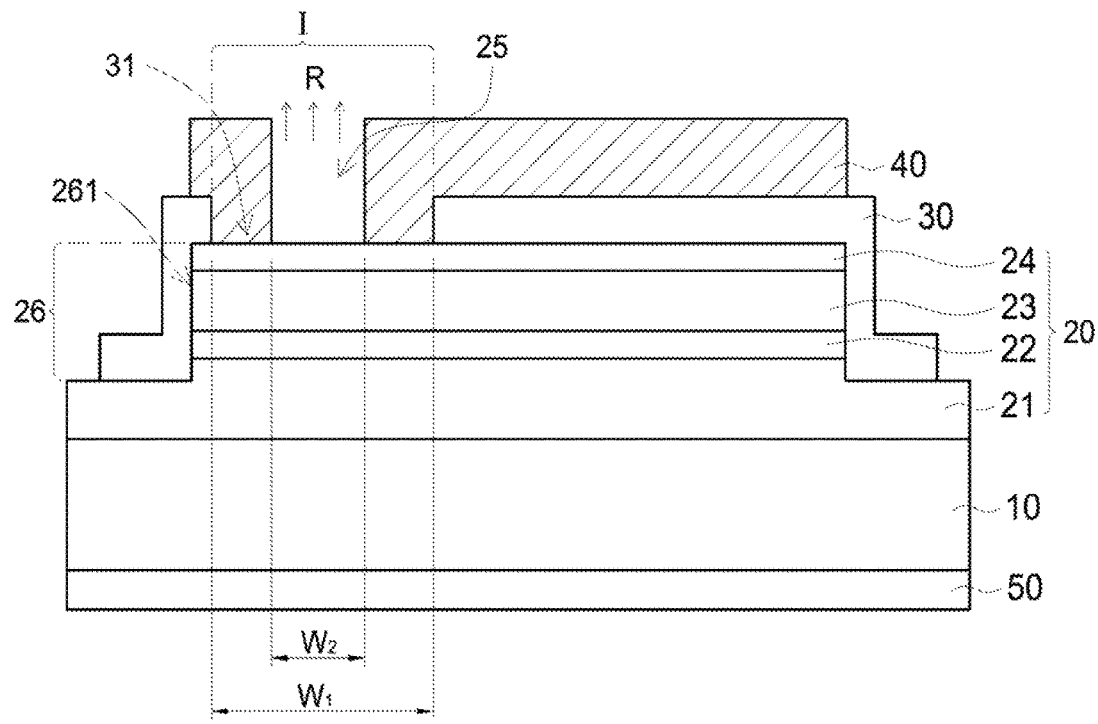
FIG. 6 is a cross-sectional diagram showing the third embodiment of the light-emitting device in accordance with the present disclosure.

FIG. 6 is a cross-sectional diagram showing the third embodiment of the light-emitting device in accordance with the present disclosure. The same reference number given or appeared in different paragraphs or figures along the specification should has the same or equivalent structure, material, material composition, the manufacturing process thereof while it is once defined anywhere of the disclosure except it is specifically described differently. The light-emitting device in accordance with the third embodiment of the present disclosure comprises substantially the same structure as the second embodiment, and the difference is that a periphery part of the epitaxial structure 20 is removed by any suitable method so as to form a ridge 26 having a width smaller than the width of the substrate 10 and comprising an exposed mesa wall 261 closer to the second opening 25 compared to the outermost edge of the substrate 10. Specifically, the current blocking layer 30 covers along the mesa wall 261 and a top surface of the first DBR stack 21. In the present embodiment, the mesa wall 261 of the ridge 26 of the epitaxial structure 20 is protected by the current blocking layer 30. As a result, the reliability of the epitaxial structure 20 and the reliability of the light-emitting device are improved. The method for manufacturing the light-emitting device as shown in FIG. 6 is substantially the same as the method for manufacturing the light-emitting device as shown in FIG. 5A and FIG. 5B. The difference is that before forming a current blocking layer 30 on the epitaxial structure 20, the method further comprises steps of patterning the epitaxial structure 20 by removing a periphery part of the second DBR stack 23, a periphery part of light-emitting stack 22, and a portion of a periphery part of the first DBR stack 21 of the epitaxial structure 20 by any suitable method to form a ridge 26 comprising a mesa wall 261. In the present embodiment, the method of the present disclosure uses no more than 3 different lithographic masks for patterning process. As a result, the method for manufacturing the light-emitting device is simple and cost effective.

Figure 7:
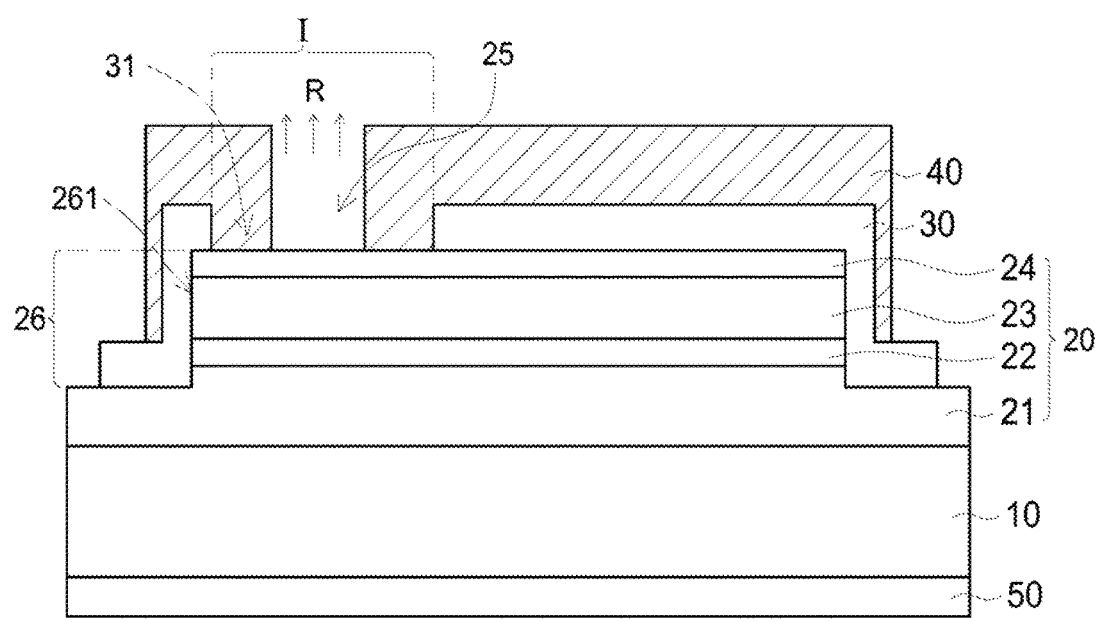
FIG. 7 is a cross-sectional diagram showing the fourth embodiment of the light-emitting device in accordance with the present disclosure.

FIG. 7 is a cross-sectional diagram showing the fourth embodiment of the light-emitting device. The same reference number given or appeared in different paragraphs or figures along the specification should has the same or equivalent structure, material, material composition, the manufacturing process thereof while it is once defined anywhere of the disclosure except it is specifically described differently. The light-emitting device in accordance with the fourth embodiment of the present disclosure comprises substantially the same structure as the third embodiment, and the difference is that the first electrode 40 covers on the current blocking layer 30 along the mesa wall 261 and thus the current blocking layer 30 is between the epitaxial structure 20 and the first electrode 40. The first electrode 40 covering on the current blocking layer 30 along the mesa wall 261 prevents radiation emitted from the light-emitting stack 22 from emitting from the mesa wall 261. The method for manufacturing the light-emitting device as shown in FIG. 7 is substantially the same as the method for manufacturing the light-emitting device as shown in FIG. 6 except that the lithographic mask for patterning the metal layer is different.

Figure 8A:
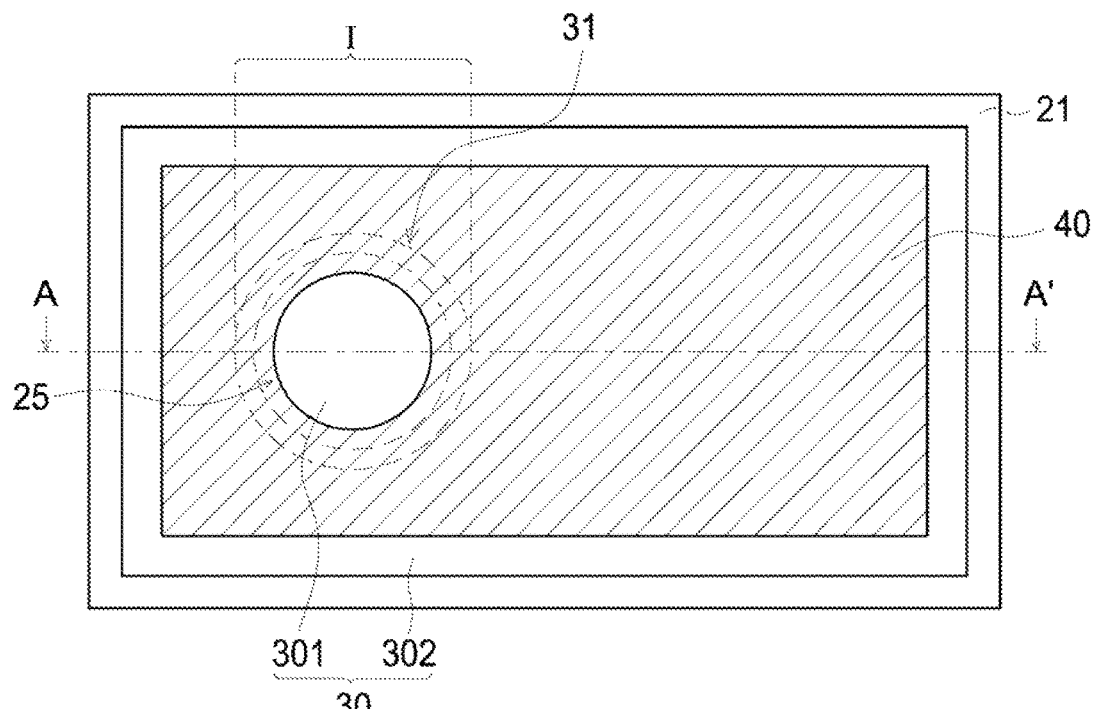
FIG. 8A is a top view of the fifth embodiment of the light-emitting device in accordance with the present disclosure.
Figure 8B:
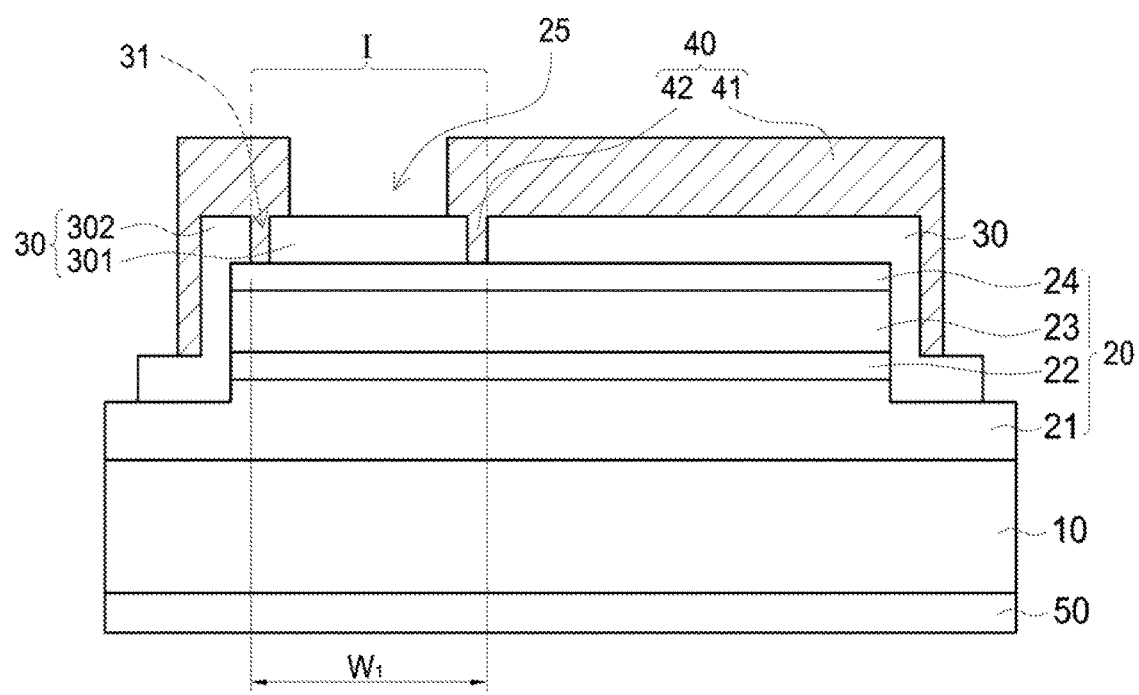
FIG. 8B is a cross-sectional diagram along an A-A' line of the light-emitting device shown in FIG. 8A.

FIG. 8A is a top view of the fifth embodiment of the light-emitting device in accordance with the present disclosure; FIG. 8B is a cross-sectional diagram along an A-A' line of the light-emitting device shown in FIG. 8A. The same reference number given or appeared in different paragraphs or figures along the specification should has the same or equivalent structure, material, material composition, the manufacturing process thereof while it is once defined anywhere of the disclosure except it is specifically described differently. The light-emitting device in accordance with the fifth embodiment of the present disclosure comprises substantially the same structure as the fourth embodiment, and the difference is that the first opening 31 is in a form of an annular ring defined by the current blocking layer 30. The current blocking layer 30 comprises an inner part 301, an outer part 302, and the first maximum width $w_1$ is the diameter of the circle enclosed by the outer part 302. The first opening 31 separates the inner part 301 of the current blocking layer 30 from the outer part 302 of the current blocking layer 30 for protecting the radiation emitting region I. The current blocking layer 30 in the present embodiment has a thickness substantially equals to $n\lambda/4$, wherein $\lambda$ is the peak wavelength of the radiation emitted from the light-emitting stack 22, and n is an odd positive integer. The first electrode 40 fills in the first opening 31, covers along the side wall of the inner part 301 of the current blocking layer 30 and is on the periphery part of the inner part 301 of the current blocking layer 30. The second opening 25 exposes the underlying inner part 301 of the current blocking layer 30. The method for manufacturing the light-emitting device as shown in FIG. 8A and FIG. 8B is substantially the same as the method for manufacturing the light-emitting device as shown in FIG. 7 except that the lithographic mask for patterning the current blocking layer 30 is different.

Figure 9A:
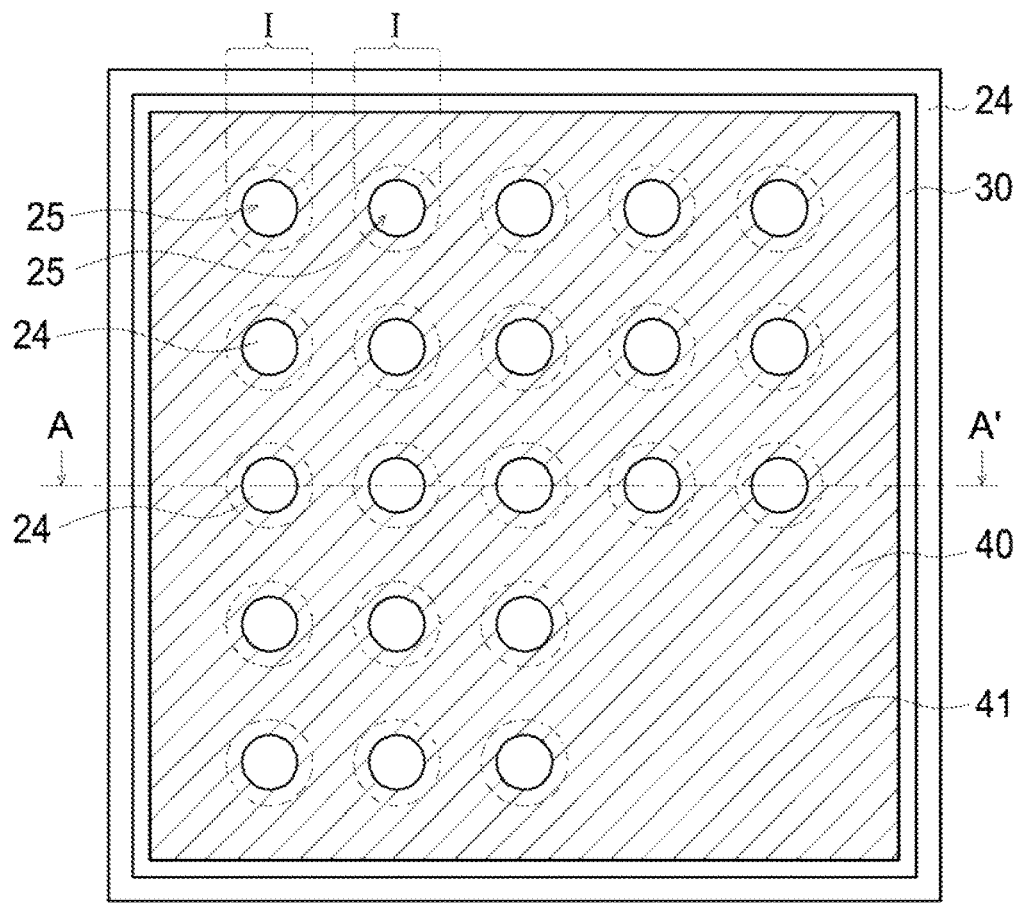
FIG. 9A is a top view of the sixth embodiment of the light-emitting device in accordance with the present disclosure.
Figure 9B:
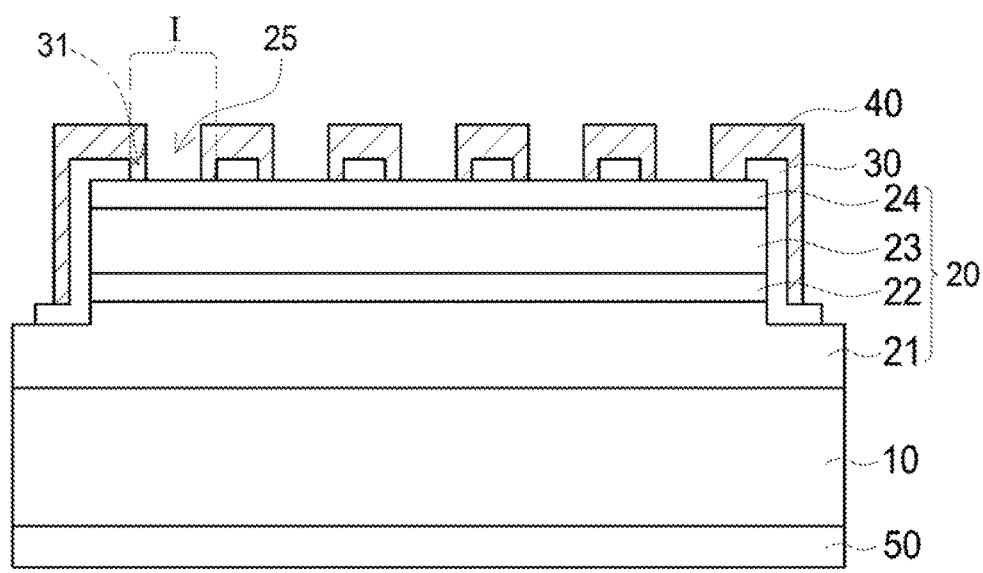
FIG. 9B is a cross-sectional diagram along an A-A' line of the light-emitting device shown in FIG. 9A.
Figure 10A:
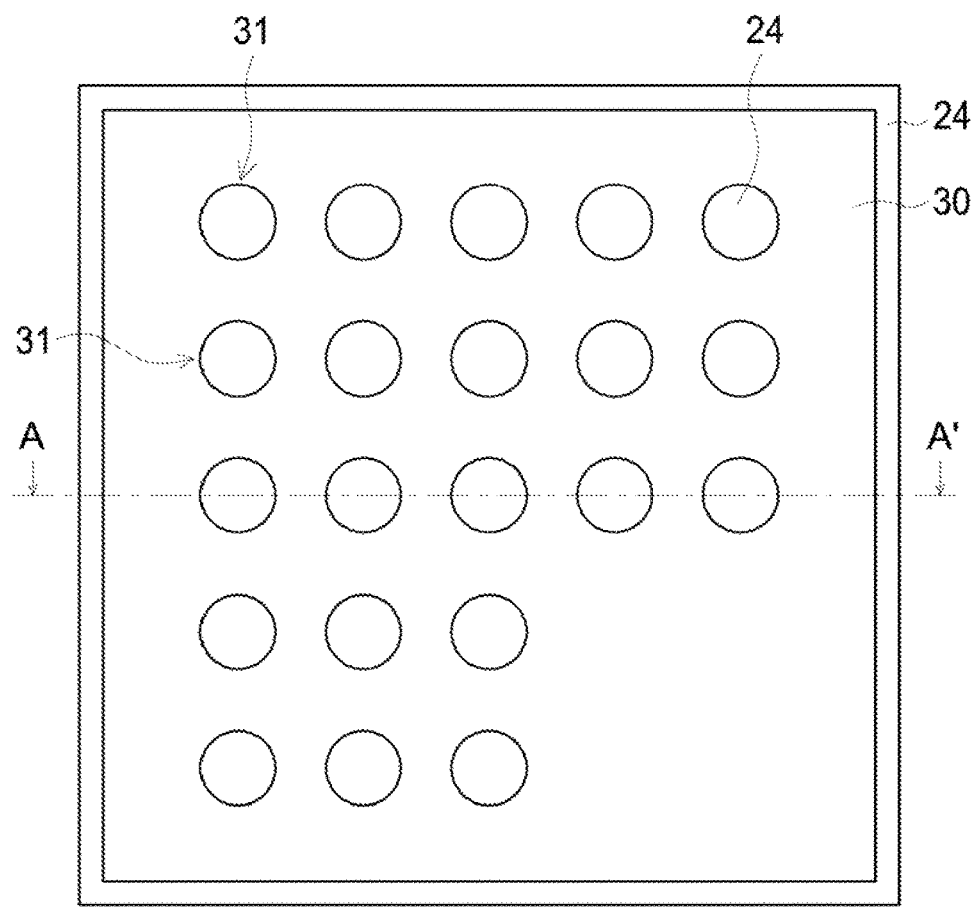
FIG. 10A is a top view of the current blocking layer of the sixth embodiment of the light-emitting device shown in FIG. 9A.
Figure 10B:
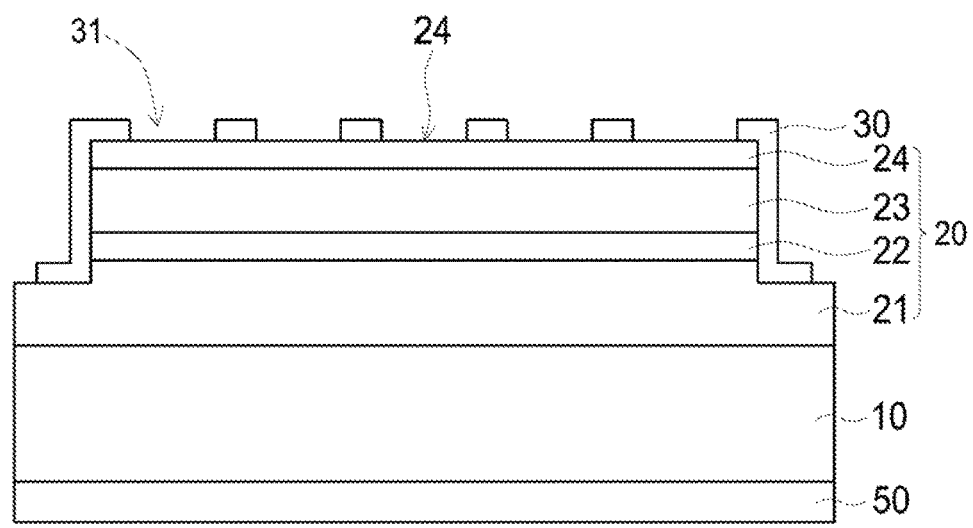
FIG. 10B shows a cross-sectional diagram along an A-A' line of the light-emitting device shown in FIG. 10A.

FIG. 9A is a top view of the sixth embodiment of the light-emitting device in accordance with the present disclosure; FIG. 9B is a cross-sectional diagram along an A-A' line of the light-emitting device shown in FIG. 9A. FIG. 10A shows a top view of the current blocking layer 30 of the sixth embodiment of the light-emitting device; FIG. 10B shows a cross-sectional diagram along an A-A' line of the light-emitting device shown in FIG. 10A. The same reference number given or appeared in different paragraphs or figures along the specification should has the same or equivalent structure, material, material composition, the manufacturing process thereof while it is once defined anywhere of the disclosure except it is specifically described differently. The light-emitting device in accordance with the sixth embodiment of the present disclosure comprises substantially the same structure as the fourth embodiment, and the difference is that the light-emitting device in the present embodiment comprises multiple radiation emitting regions I arranged in a two-dimensional array in a single chip. Specifically, multiple first openings 31 are formed in the current blocking layer 30 to expose the contact layer 24. The current blocking layer 30 is a contiguous layer as shown in FIG. 10A. The first openings 31 are separated from one another by the current blocking layer 30. Multiple second openings 25 arranged in a two-dimensional array are formed in the first electrode 40 and are separated from one another, wherein each of the second openings 25 is correspondingly formed within one of the first openings 31 to expose the contact layer 24 such that the corresponding first opening 31 and second opening 25 are concentric. The first electrode 40 is a contiguous layer and has a bonding portion 41 without having any second openings 25 formed therein for bonding a wire. A part of the first electrode 40 fills in the first openings 31, covers along the side walls of the current blocking layer 30 enclosing the first openings 31 and direct contacts the contact layer 24 of the epitaxial structure 20. The region of the epitaxial structure 20 directly contacting the first electrode 40 and substantially directly under the first openings 31 functions as radiation emitting regions I. The arrangement of the radiation emitting regions I is not limited to the present embodiment, for example, the radiation emitting regions I can be arranged in a staggered arrangement or the numbers of the radiation emitting regions I of two adjacent rows and/or columns can be different.

Figure 11A:
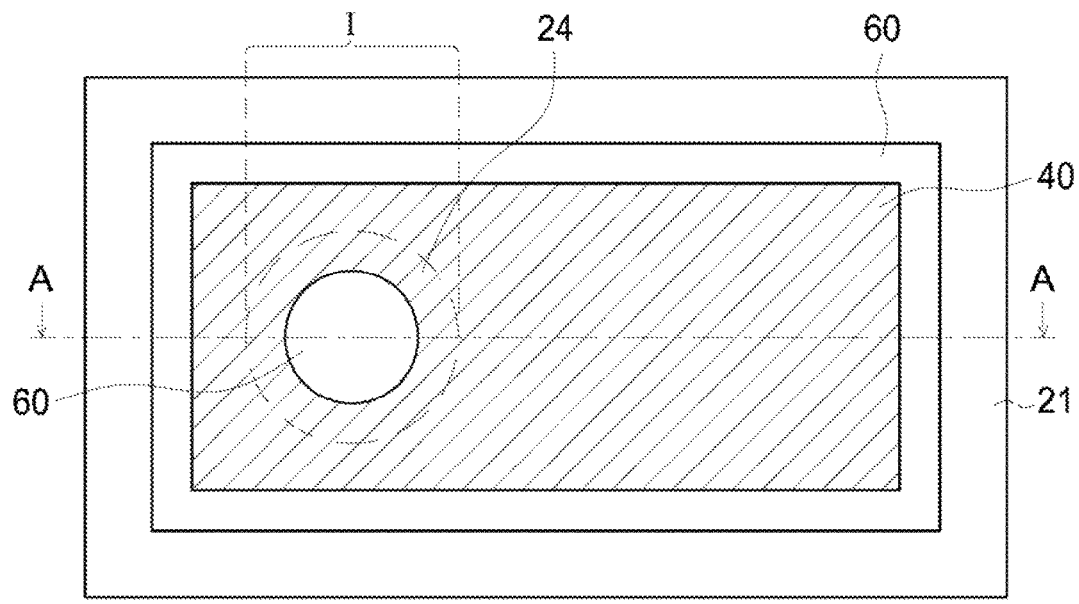
FIG. 11A is a top view of the seventh embodiment of the light-emitting device in accordance with the present disclosure.
Figure 11B:
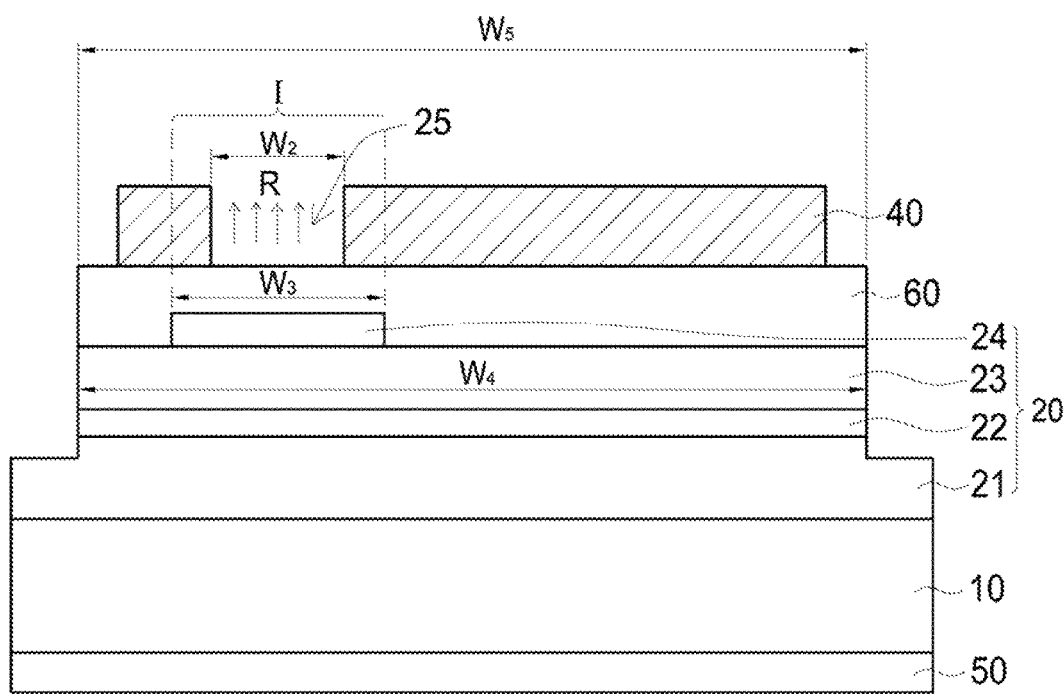
FIG. 11B is a cross-sectional diagram along an A-A' line of the light-emitting device shown in FIG. 11A.

FIG. 11A is a top view of the seventh embodiment of the light-emitting device in accordance with the present disclosure; FIG. 11B is a cross-sectional diagram along an A-A' line of the light-emitting device shown in FIG. 11A. The same reference number given or appeared in different paragraphs or figures along the specification should has the same or equivalent structure, material, material composition, the manufacturing process thereof while it is once defined anywhere of the disclosure except it is specifically described differently. In the present embodiment, the substrate 10, the first DBR stack 21, the light-emitting stack 22, the second DBR stack 23 are substantially the same as the second embodiment. The difference is that the contact layer 24 has a first width $w_3$, and the second DBR stack 23 has a second width $w_4$ greater than the first width $w_3$. The light-emitting device further comprises a conductive layer 60 covering the contact layer 24 and interposed between the first electrode 40 and the contact layer 24. The conductive layer 60 has a third width $w_5$ substantially the same as the second width $w_4$ of the second DBR stack 23. The first electrode 40 covers more than 50% of the surface area of the conductive layer 60. Preferably, the first electrode 40 covers more than 80%, and more preferably, more than 90% of the surface area of the conductive layer 60. The first electrode 40 has a contour substantially the same as the contour of the conductive layer 60. The first electrode 40 directly contacts the conductive layer 60 instead of directly contacting the contact layer 24. The second DBR stack 23, the light-emitting stack 22 and the first DBR stack 21 directly under the contact layer 24 functions as a radiation emitting region I. The radiation R escapes out of the light-emitting device through the second opening 25.

The second opening 25 is directly over the contact layer 24 and exposes the underlying conductive layer 60. A ratio of the first width $w_3$ of the contact layer 24 to the second maximum width $w_2$ of the second opening 25 is between 0.1 and 3, and preferably, is between 0.5 and 1.1, and more preferably between 0.6 and 0.8. By having the ratio of the first width $w_3$ to the second maximum width $w_2$ less than 1, the first electrode 40 is less likely to shield the light generating from the radiation emitting region I, and thus more light escapes from the second opening 25.

The conductivity of the portion of the second DBR stack 23 directly under the contact layer 24 is substantially the same as the conductivity of the portion of the second DBR stack 23 not covering by the contact layer 24. The conductive layer 60 has an thickness substantially equal to $n\lambda/4$, wherein $\lambda$ is the peak wavelength of the radiation emitted from the light-emitting stack 22, and n is an odd positive integer. The conductive layer 60 comprises transparent conductive metal oxide material, such as indium tin oxide (ITO), aluminum zinc oxide (AZO), SnCdO, antimony tin oxide (ATO), ZnO, $Zn_2SnO_4$ (ZTO) or indium zinc oxide (IZO). The conductive layer 60 is substantially transparent to the radiation emitted by the light-emitting stack 22.

When a current flows into the epitaxial structure 20 from the first electrode 40, because the contact resistance between the contact layer 24 and the second DBR stack 23 is relatively lower than the contact resistance between the conductive layer 60 and the epitaxial structure 20, the current mostly flows from the conductive layer 60 toward the contact layer 24, and then into the epitaxial structure 20 mainly through the contact layer 24. That is, the current density of the portion of the second DBR stack 23 directly under the contact layer 24 is much higher than the current density of the portion of the second DBR stack 23 without being covered by the contact layer 24. Specifically, the topmost layer of the epitaxial structure 20, in the present embodiment, the contact layer 24, is the first layer in the epitaxial structure 20 to conduct a confined current in the light-emitting device.

Figure 12A:
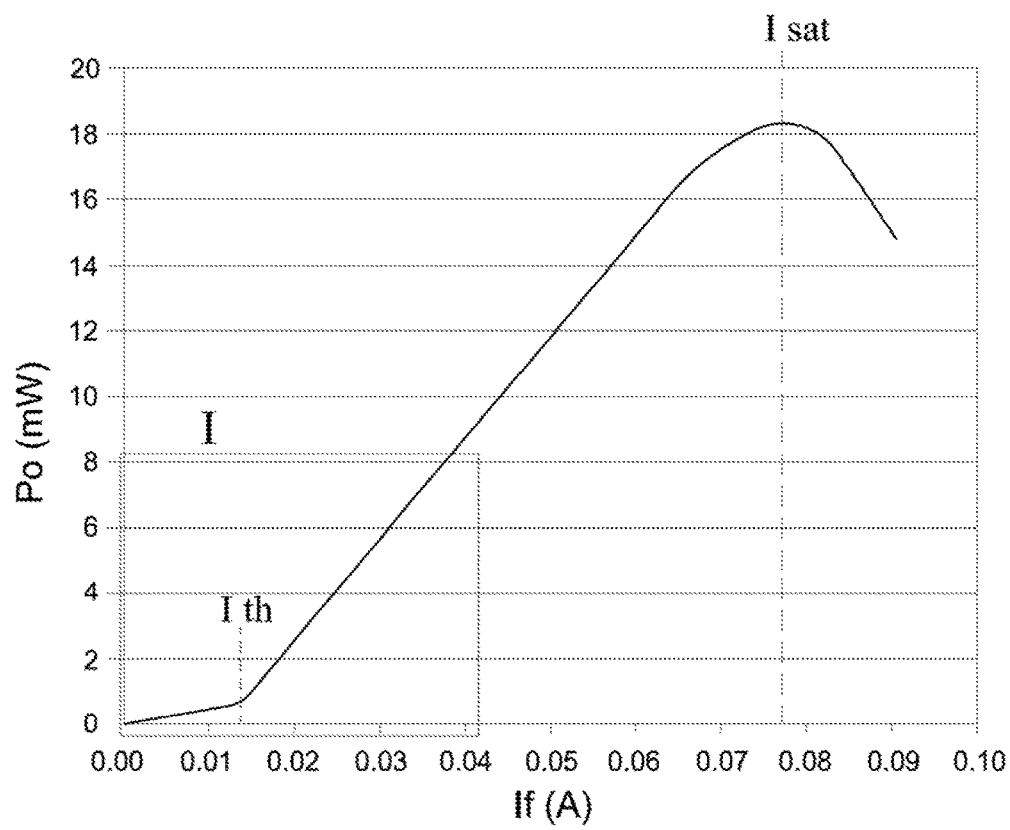
FIG. 12A shows a relationship curve of optical output power vs. forward current of the seventh embodiment of the light-emitting device.
Figure 12B:
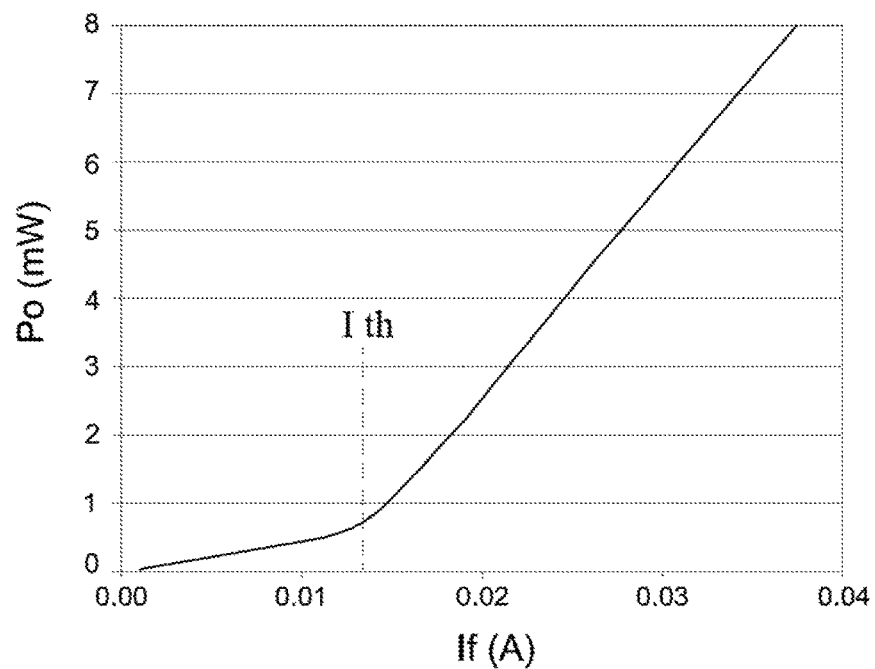
FIG. 12B shows an enlarged detail of region I in FIG. 12A.

FIG. 12A is a radiation output vs. forward current curve of the light-emitting device of the seventh embodiment, wherein the ratio of the first width $w_3$ of the contact layer 24 to the second maximum width $w2$ of the second opening 25 is about 1. FIG. 12B is a graph showing an enlarged detail of region I in FIG. 12A. In the present embodiment, the lasing threshold current $I_{th}$ is about 13 mA, and the saturation current $I_{sat}$ is about 79 mA. The lasing threshold current $I_{th}$, the saturation current $I_{sat}$ and a difference between the lasing threshold current $I_{th}$ and the saturation current $I_{sat}$ can be adjusted by the first width $w_3$ of the contact layer 24 for different applications, for example, if a higher lasing threshold current $I_{th}$, a higher saturation current $I_{sat}$ and a higher difference between the lasing threshold current $I_{th}$ and the saturation current $I_{sat}$ are needed, the first width $w_3$ can be larger. Specifically, the lasing threshold current $I_{th}$ and the first width $w_3$ fulfill the following equation:

$$0.4w_{3(\mu m)} - 7 \leq I_{th(mA)} \leq 0.4w_{3(\mu m)} + 7$$

In one embodiment, the radiation having a peak wavelength about 850±10 nm. In one embodiment, the radiation having a peak wavelength about 940±10 nm.

Table 2 shows far-field angles of the radiation having a peak wavelength of 850±10 nm emitted by the light-emitting device of the seventh embodiment at different forward currents.

TABLE 2

| forward current (mA) | Far-field angle |
|---|---|
| 15 | 10.54° |
| 18 | 10.90° |
| 22 | 10.9° |

Table 3 shows far-field angles and radiation output of the radiation having a peak wavelength of 940±10 nm of the light-emitting device of the seventh embodiment at different forward currents. In the present embodiment, the lasing threshold current $I_{th}$ is about 13 mA, and the saturation current is about 80 mA.

TABLE 3

| injected current (mA) | Far-field angle | $P_0$ (mW) |
|---|---|---|
| 15 | 9.61° | 1.09 |
| 18 | 11.03° | 1.95 |
| 22 | 11.19° | 3.2 |

From Table 2 and 3, when a forward current is higher than the lasing threshold current $I_{th}$ and lower than the saturation current $I_{sat}$, the far-field angle of the radiation is less than 15 degrees, and preferably, between 5 and 15 degrees, and more preferably, between 8 and 13 degrees.

In the present disclosure, although the light-emitting device is devoid of a highly resistive structure comprising an oxidized layer and an ion implanted layer in the second DBR stack 23, by comprising the contact layer 24 and the conductive layer 60, which results in the topmost layer of the epitaxial structure 20 being the first layer in the epitaxial structure 20 to conduct a confined current in the light-emitting device, the light-emitting device has a far-field angle smaller than 15 degrees when a forward current is in a range between the lasing threshold current $I_{th}$ and the saturation current $I_{sat}$.

Figure 13A:
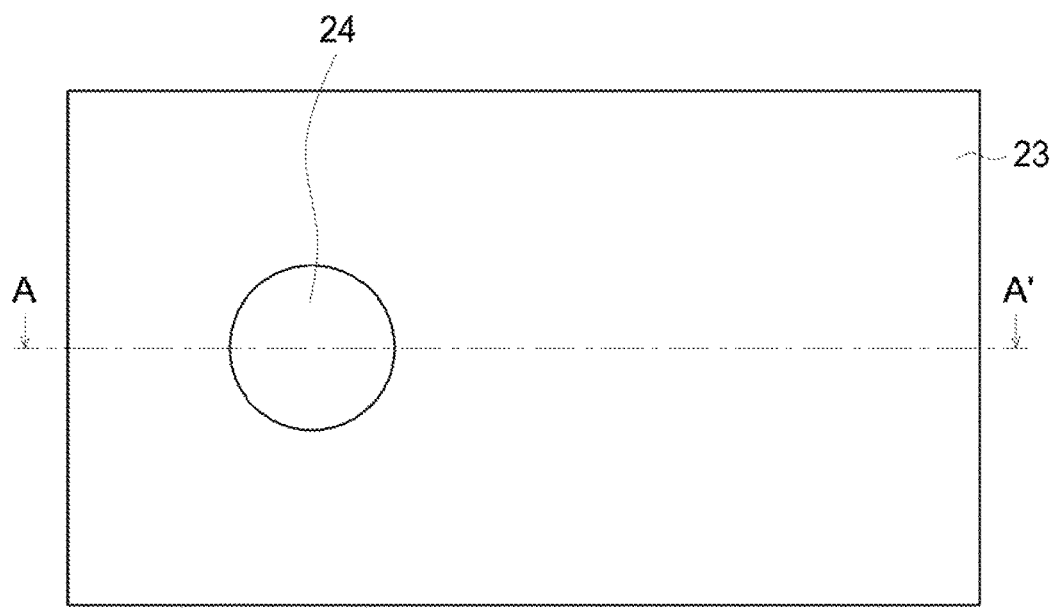
FIG. 13A through FIG. 16B demonstrate the method for manufacturing the light-emitting device shown in FIG. 11A and FIG. 11B.
Figure 13B:
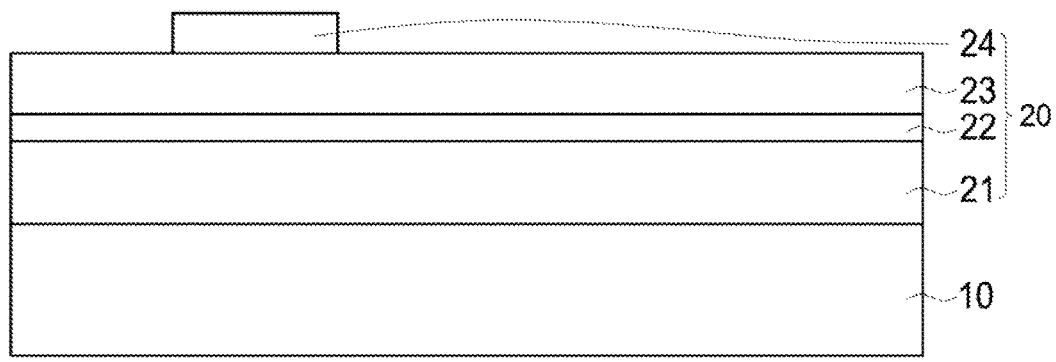
Figure 14A:
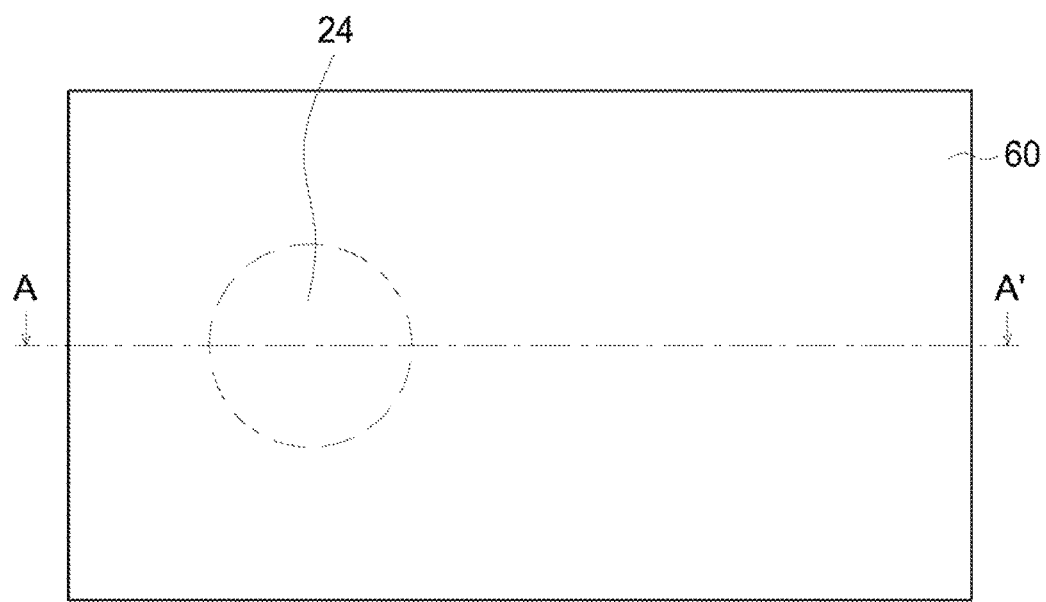
Figure 14B:
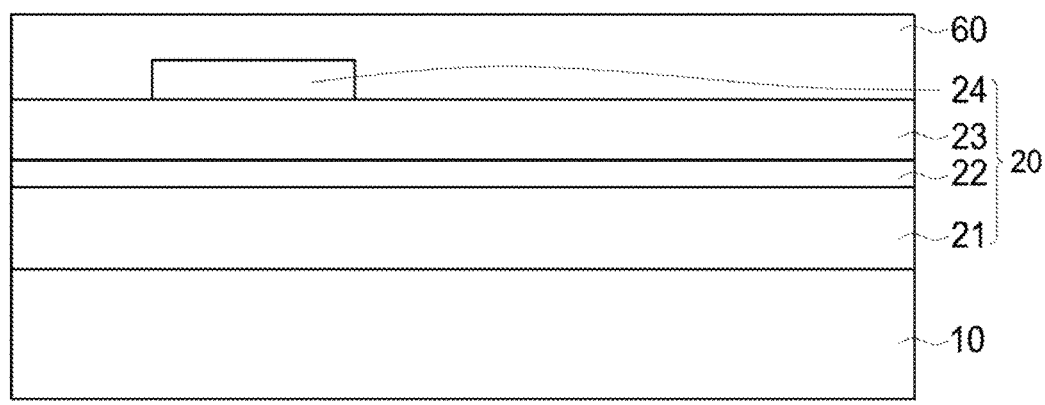
Figure 15A:
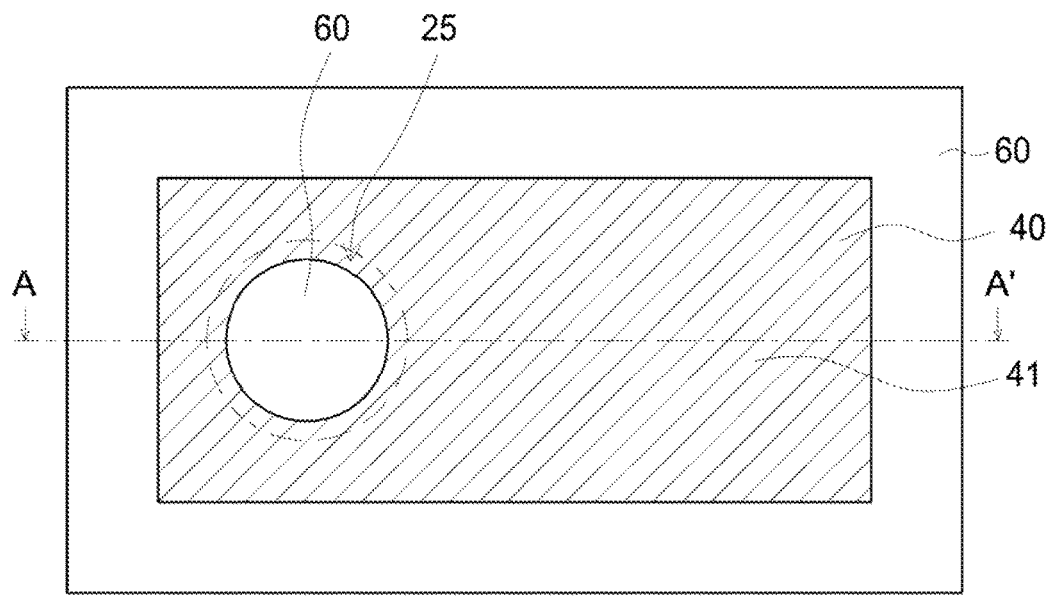
Figure 15B:
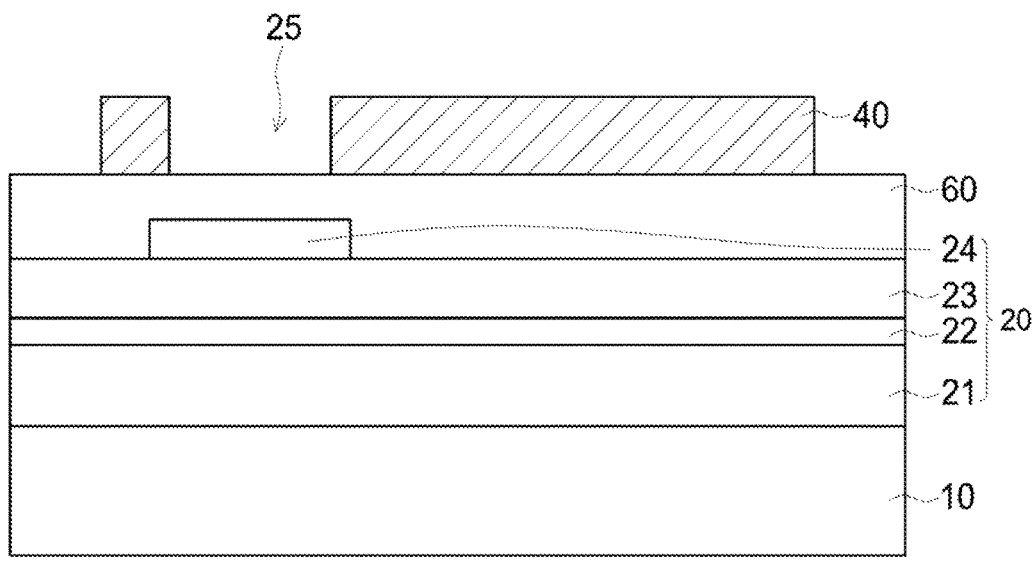
Figure 16A:
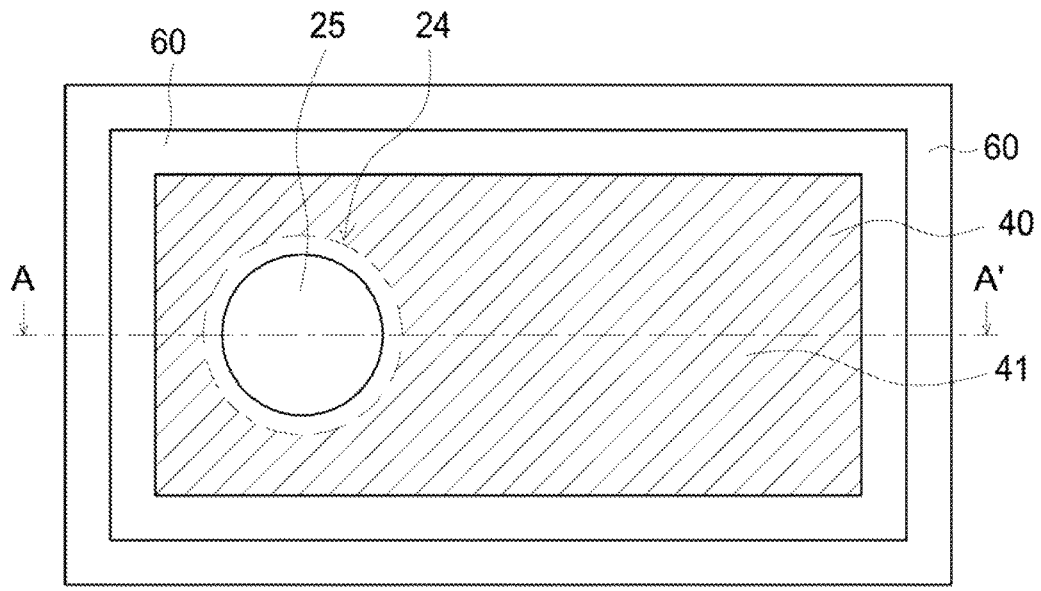
Figure 16B:
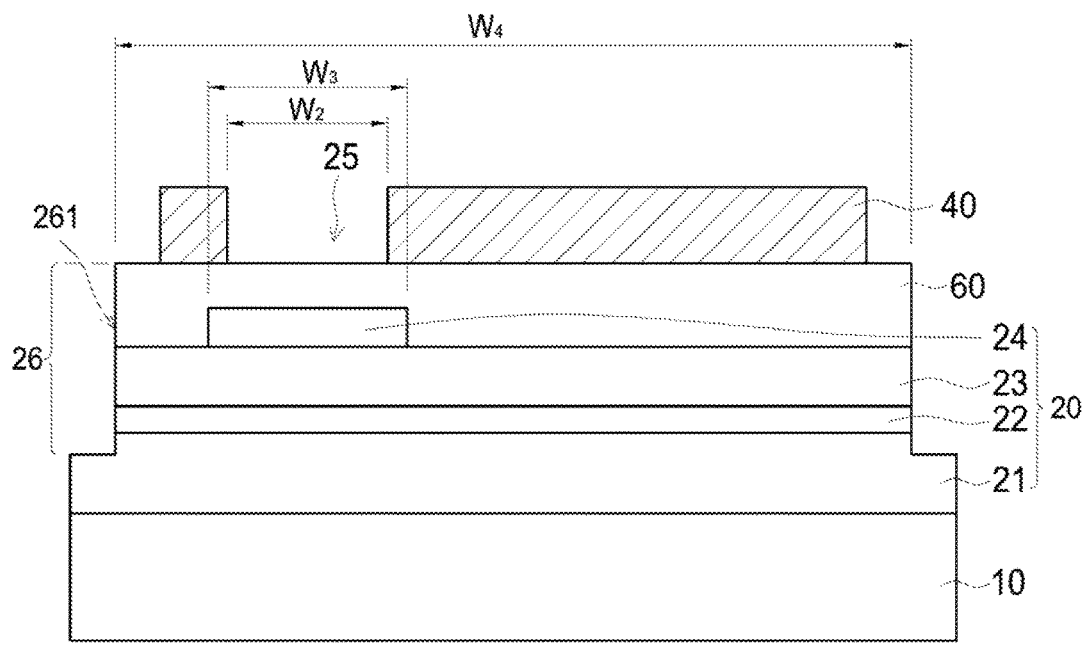

FIGS. 13A through 16B demonstrate the method for manufacturing the light-emitting device shown in FIG. 11A and FIG. 11B. The method comprises the steps of:

a. referring to FIG. 13A and FIG. 13B, providing a substrate 10;
b. forming an epitaxial structure 20 on the substrate 10 by epitaxial growth;
c. patterning the contact layer 24 by a lithographic mask;
d. referring to FIG. 14A and FIG. 14B, forming a conductive layer 60 covering the patterned contact layer 24 by any suitable method such as sputtering or evaporation;
e. referring to FIG. 15A and FIG. 15B, forming a metal layer (nor shown) on the conductive layer 60;
f. patterning the metal layer by a lithographic mask to form a first electrode 40 and a second opening 25 in the first electrode 40, wherein the first electrode 40 has a pattern substantially complementary to t the pattern of the contact layer 24, that is, the pattern of the contact layer 24 is substantially the same as that of the second opening 25 of the first electrode 40; the second opening 25 is substantially directly over the contact layer 24;
g. referring to FIG. 16A and FIG. 16B, removing a periphery part of the epitaxial structure 20 to form a ridge 26 comprising an exposed mesa wall 261 closer to the second opening 25 compared to the outermost edge of the substrate 10;
h. forming a second electrode 50 on the side of the substrate 10 opposite to the epitaxial structure 20; and
i. dicing the structure formed at step h to obtain an individual finished light-emitting device as shown in FIG. 11A and FIG. 11B.

The method of the present disclosure is also devoid a step of reducing conductivity of one layer in the second DBR stack 23, such as an oxidation step, an ion implantation step to implant at least one conductivity reducing ion into at least one layer in the second DBR stack 23 and/or an etching step to selectively etch away a periphery part of at least one layer in the second DBR stack 23 to form an undercut aperture such that the conductivity in the oxidized region, the ion implanted region, or the undercut aperture as shown in FIG. 24 is lower than the other region of the second DBR stack 23. The oxidation step, the ion implantation step and the step of etching one of the layers in the second DBR stack 23 are for turning a part of the second DBR stack 23 directly under the first electrode 40 into a substantially insulated region so as to from a highly resistive structure in the second DBR stack 23. Preferably, the method of the present disclosure uses no more than 3 different lithographic masks for patterning process. As a result, the method for manufacturing the light-emitting device is simple and cost effective.

Figure 17A:
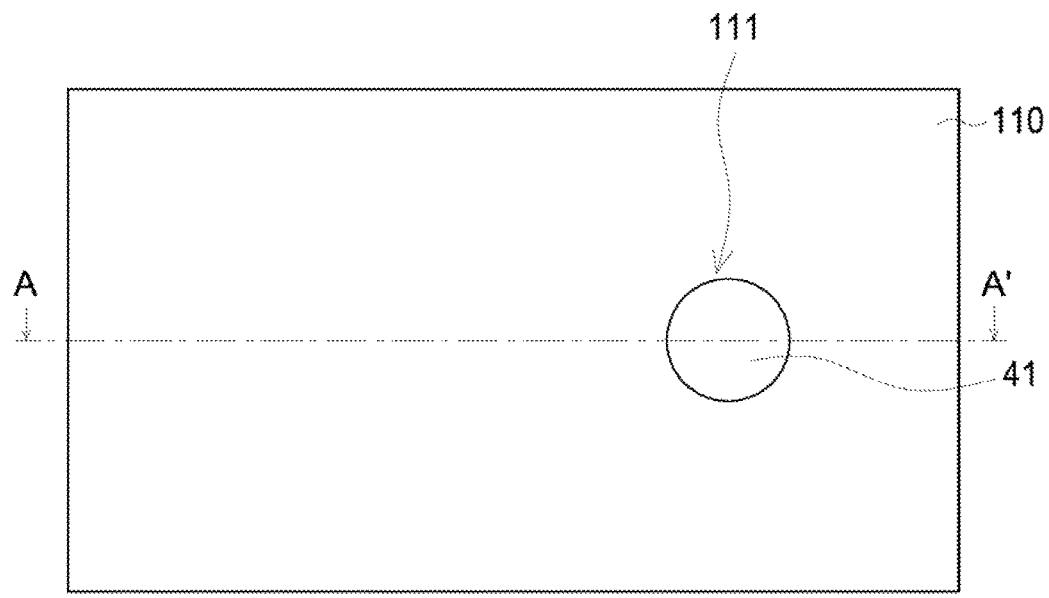
FIG. 17A is a top view of the eighth embodiment of the light-emitting device in accordance with the present disclosure.
Figure 17B:
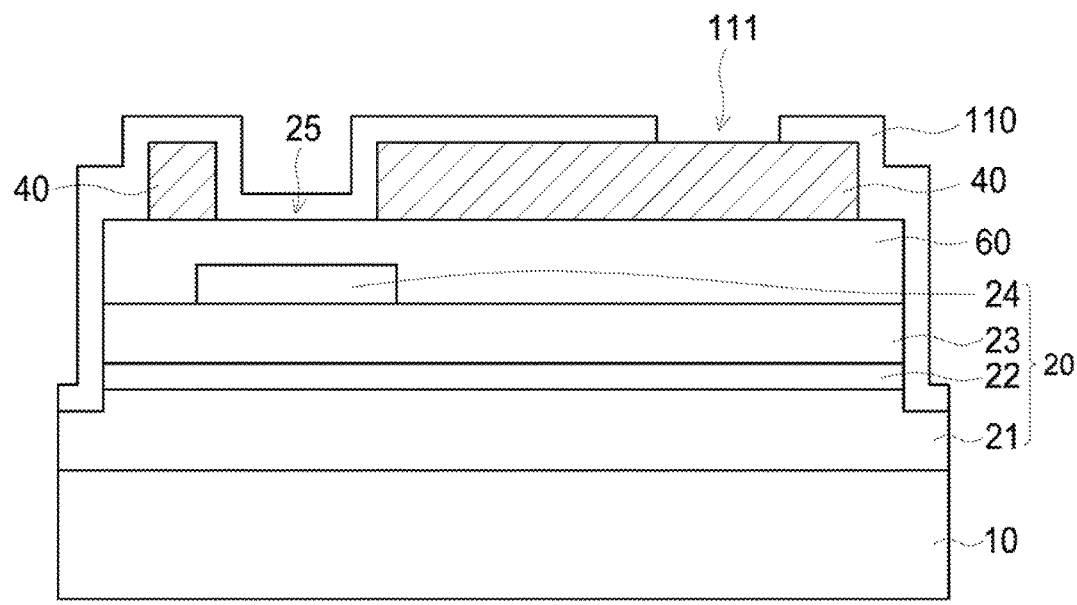
FIG. 17B is a cross-sectional diagram along an A-A' line showing the eighth embodiment of the light-emitting device shown in FIG. 17A.

FIG. 17A is a top view of the eighth embodiment of the light-emitting device in accordance with the present disclosure; FIG. 17B is a cross-sectional diagram along line A-A' of the light-emitting device shown in FIG. 17A. The same reference number given or appeared in different paragraphs or figures along the specification should has the same or equivalent structure, material, material composition, the manufacturing process thereof while it is once defined anywhere of the disclosure except it is specifically described differently. The light-emitting device in accordance with the eighth embodiment of the present disclosure comprises substantially the same structure as the seventh embodiment, and the difference is that the light-emitting device further comprises a passivation layer 110 substantially and conformably covering the epitaxial structure 20, the conductive layer 60 and the first electrode 40. The passivation layer 110 comprises an opening 111 exposing the underlying first electrode 40 and away from the contact layer 24 for a wire bonded thereto. The method for manufacturing the light-emitting device as shown in FIG. 17A and FIG. 17B is substantially the same as the method for manufacturing the light-emitting device as shown in FIG. 16A and FIG. 16B. The difference is that after the step of forming a ridge 26 comprising an exposed mesa wall 261, the method further comprises steps of conformably forming a passivation layer 110 along the exposed mesa wall 261 of the epitaxial structure 20, along a side wall of the conductive layer 60, along a side wall of the first electrode 40 and covering the conductive layer 60 and the first electrode 40; then, patterning the passivation layer 110 to form an opening 111 in the passivation layer 110 for exposing the underlying first electrode 40. The method of the present disclosure uses no more than 4 different lithographic masks for patterning process. As a result, the method for manufacturing the light-emitting device is simple and cost effective.

Figure 18:
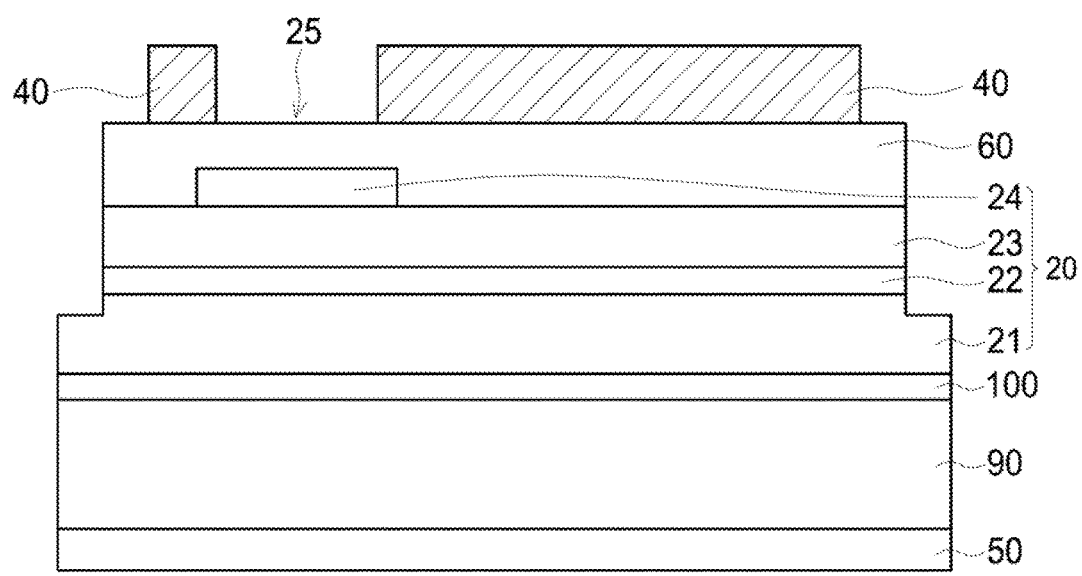
FIG. 18 is a cross-sectional diagram showing the ninth embodiment of the light-emitting device in accordance with the present disclosure.
Figure 19A:
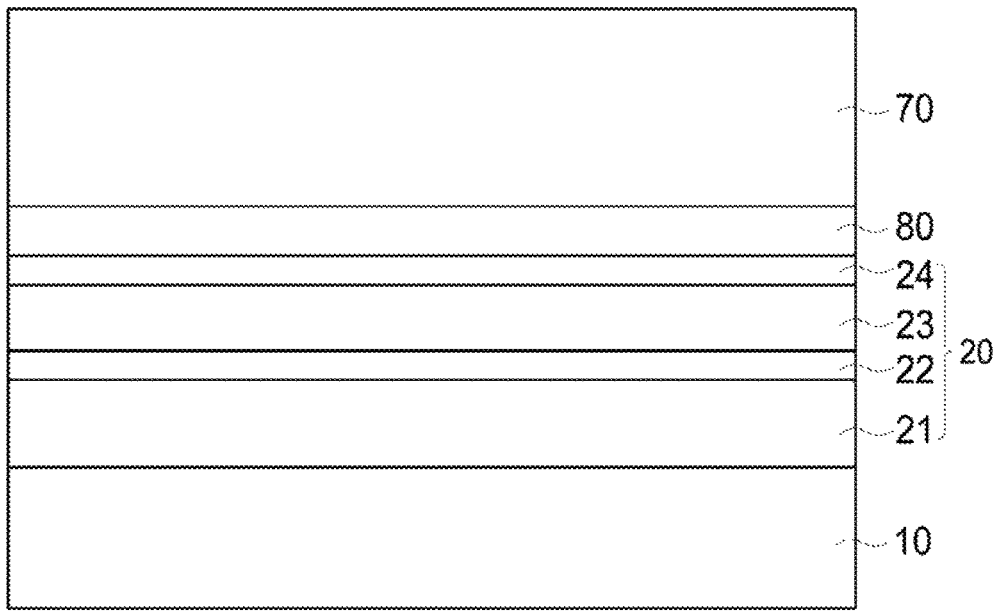
FIGS. 19A through 19D demonstrate the method for manufacturing the light-emitting device shown in FIG. 18.
Figure 19B:
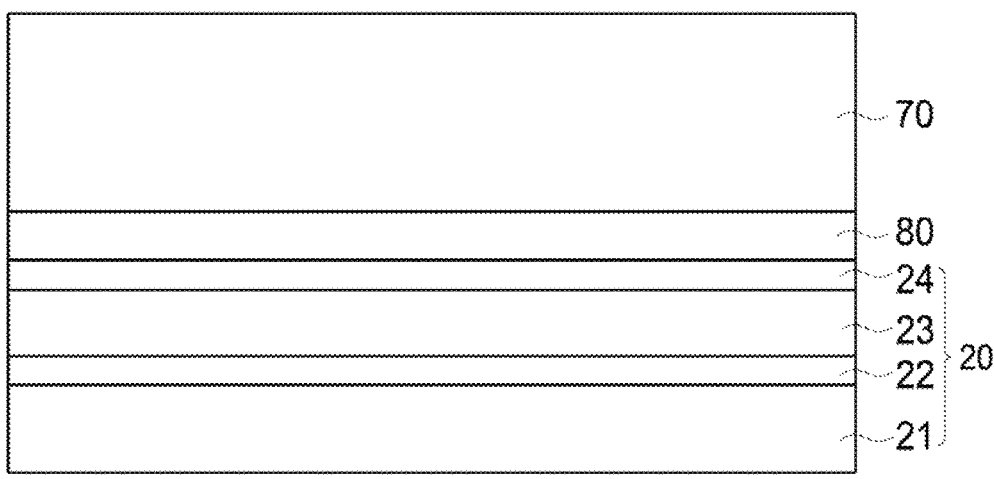
Figure 19C:
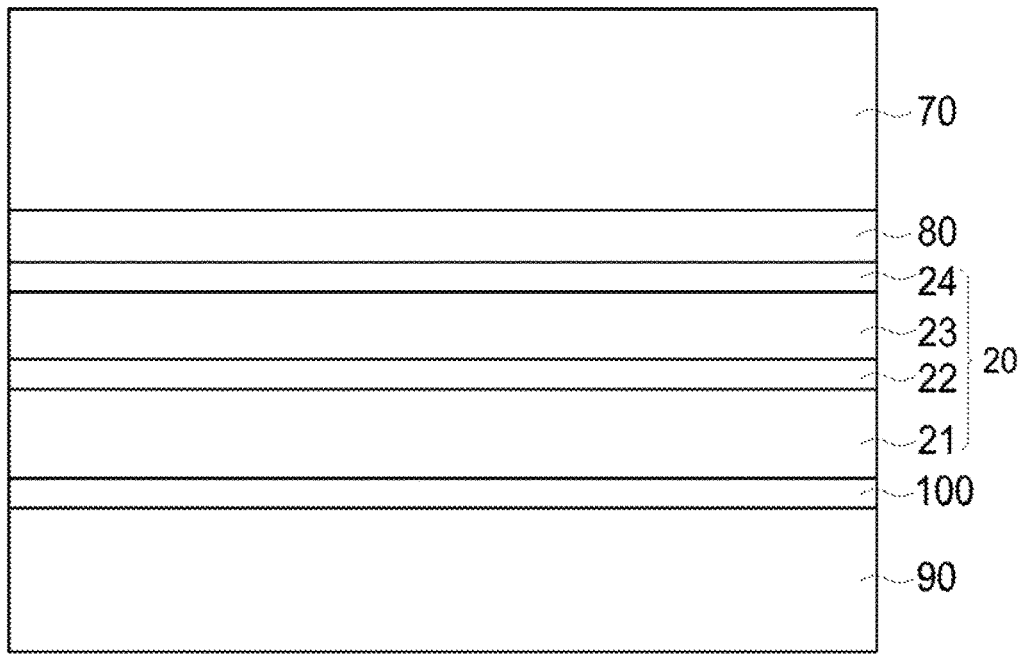
Figure 19D:
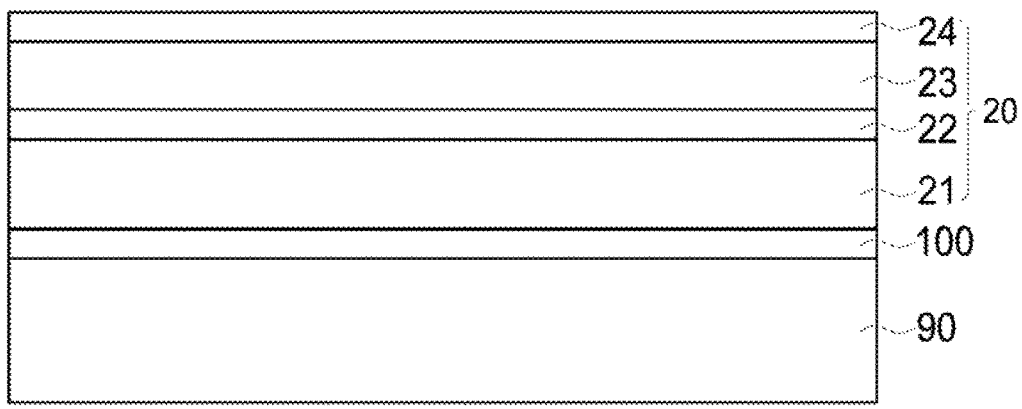

FIG. 18 is a cross-sectional diagram showing the ninth embodiment of the light-emitting device. The top view of the light-emitting device is substantially the same as shown in FIG. 11A. The same reference number given or appeared in different paragraphs or figures along the specification should has the same or equivalent structure, material, material composition, the manufacturing process thereof while it is once defined anywhere of the disclosure except it is specifically described differently. The light-emitting device in accordance with the eighth embodiment of the present disclosure comprises substantially the same structure as the seventh embodiment, and the difference is that the light-emitting device of the present embodiment comprises a permanent substrate 90 and a bonding layer 100 between the permanent substrate 90 and the epitaxial structure 20. In the present embodiment, the permanent substrate 90 has a thermal conductivity higher than that of the substrate 10. The bonding layer 100 is for connecting the permanent substrate 90 and the epitaxial structure 20. FIGS. 19A through 19D demonstrate the method for manufacturing the light-emitting device shown in FIG. 18. The method for manufacturing the light-emitting device as shown in FIG. 18 is substantially the same as the method for manufacturing the light-emitting device as shown in FIG. 11A and FIG. 11B. The difference is that before patterning the contact layer 24, the method further comprises the steps of bonding the epitaxial structure 20 to a temporary substrate 70 by a temporary bonding layer 80 as shown in FIG. 19A, in the present embodiment, wherein the temporary substrate 70 comprises glass; removing the substrate 10 by any suitable method as shown in FIG. 19B; bonding the epitaxial structure 20 to a permanent substrate 90 by a bonding layer 100 as shown in FIG. 19C; and removing the temporary substrate 70 and the temporary bonding payer 80 as shown in FIG. 19D. In the present embodiment, by the method comprising the bonding steps, the light-emitting device comprises the permanent substrate 90 with a higher thermal conductivity. As a result, the light-emitting device achieves a higher output power.

Figure 20A:
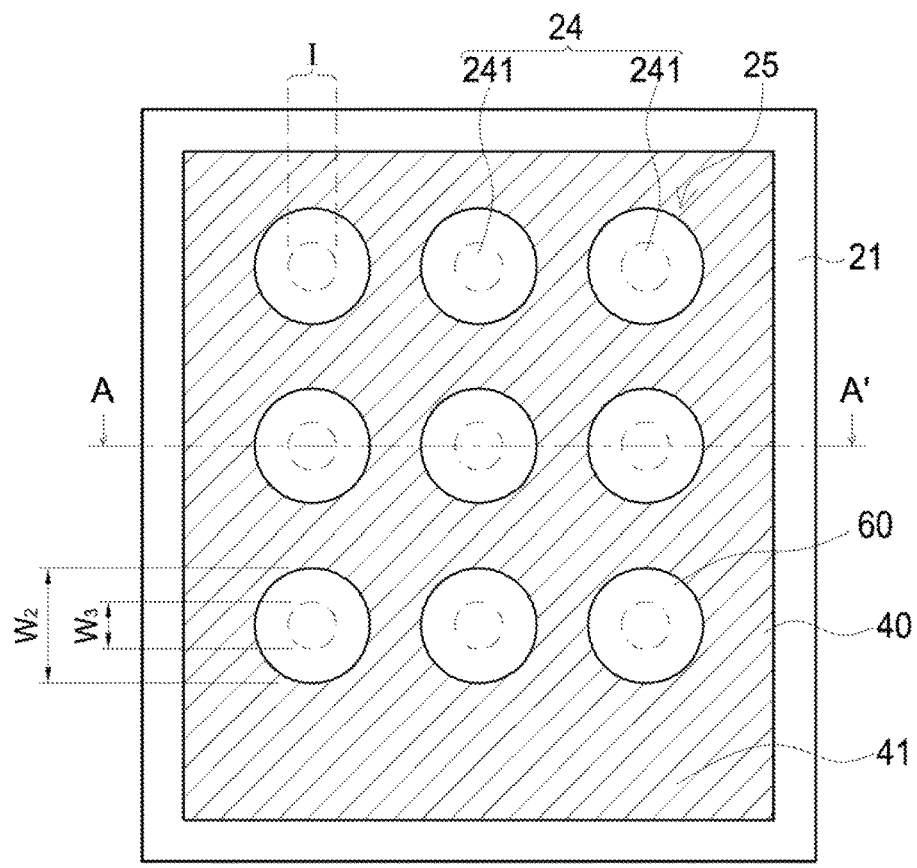
FIG. 20A is a top view of the tenth embodiment of the light-emitting device in accordance with the present disclosure.
Figure 20B:
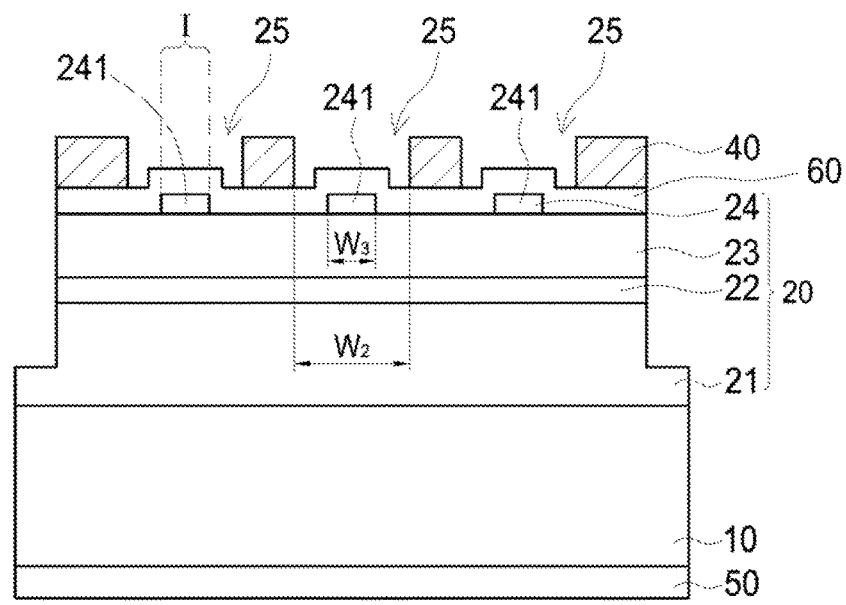
FIG. 20B is a cross-sectional diagram along an A-A' line showing the tenth embodiment of the light-emitting device shown in FIG. 20A.

FIG. 20A is a top view of the tenth embodiment of the light-emitting device in accordance with the present disclosure; FIG. 20B is a cross-sectional diagram along an A-A' line showing the light-emitting device shown in FIG. 20A. The same reference number given or appeared in different paragraphs or figures along the specification should has the same or equivalent structure, material, material composition, the manufacturing process thereof while it is once defined anywhere of the disclosure except it is specifically described differently. The light-emitting device in accordance with the tenth embodiment of the present disclosure comprises substantially the same structure as the seventh embodiment, and the difference is that the light-emitting device in the present embodiment comprises multiple radiation emitting regions I arranged as an array in a single chip. Specifically, the contact layer 24 comprises multiple discrete contact regions 241 arranged in a two-dimensional array as shown in FIG. 20A. Each contact region 241 has a first width $w_3$. In the present embodiment, the first widths $w_3$ of the contact regions 241 are substantially the same. The conductive layer 60 is a contiguous layer and covering the multiple discrete contact regions 241 as shown in FIG. 20B. The first electrode 40 is on the conductive layer 60 and is a contiguous layer. Multiple second openings 25 are formed in the first electrode 40 and are separated from one another, wherein each of the second openings 25 is correspondingly formed to align with one of the contact regions 241. The second openings 25 expose the conductive layer 60. A ratio of the width of one of the contact regions 241 to the second width $w_2$ of the second opening 25 is between 0.1 and 3, and preferably, is between 0.9 and 1.1. In the present embodiment, the ratios are substantially the same. The second DBR stack 23, the light-emitting stack 22 and the first DBR stack 21 that are directly under the contact regions 241 and exposed by the second openings 25 function as radiation emitting regions I. The number of the contact regions 241 and the second openings 25 are not limited to the present embodiment, and the arrangement of the radiation emitting regions I is not limited to the present embodiment, for example, the radiation emitting regions I can be arranged in a staggered arrangement or the numbers of the radiation emitting regions I of two adjacent rows and/or columns can be different. Specifically, the topmost layer of the epitaxial structure 20, in the present embodiment, the contact layer 24, is the first layer in the epitaxial structure 20 to conduct a confined current in the light-emitting device.

Figure 21A:
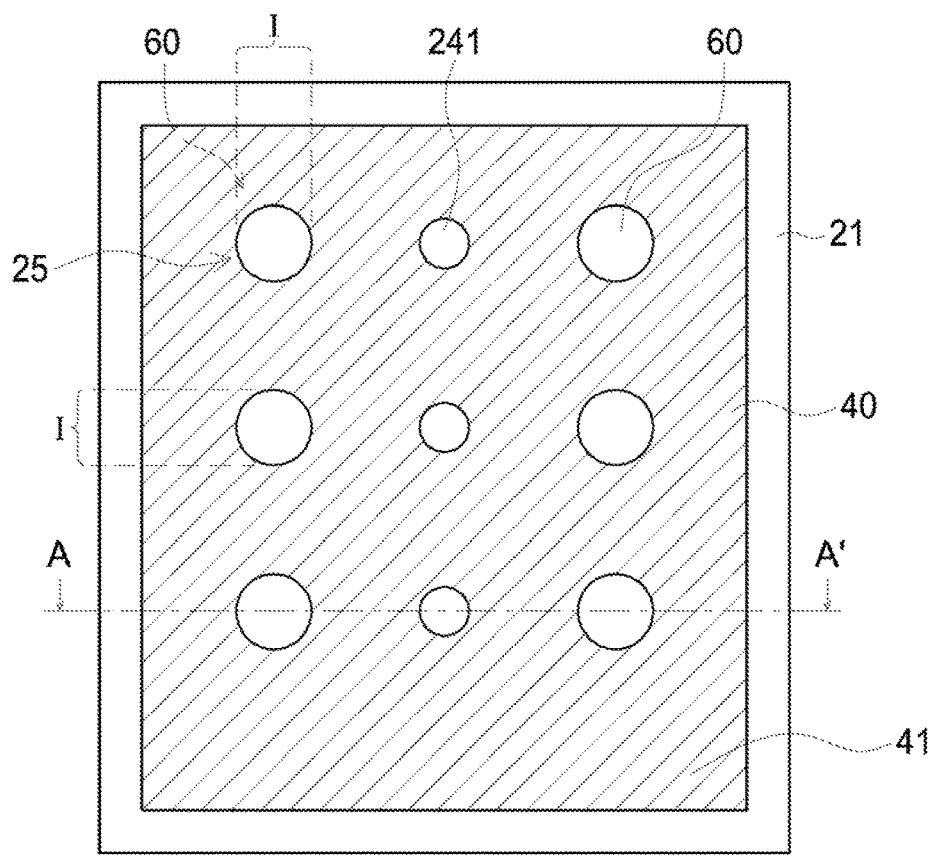
FIG. 21A is a top view of the eleventh embodiment of the light-emitting device in accordance with the present disclosure.
Figure 21B:
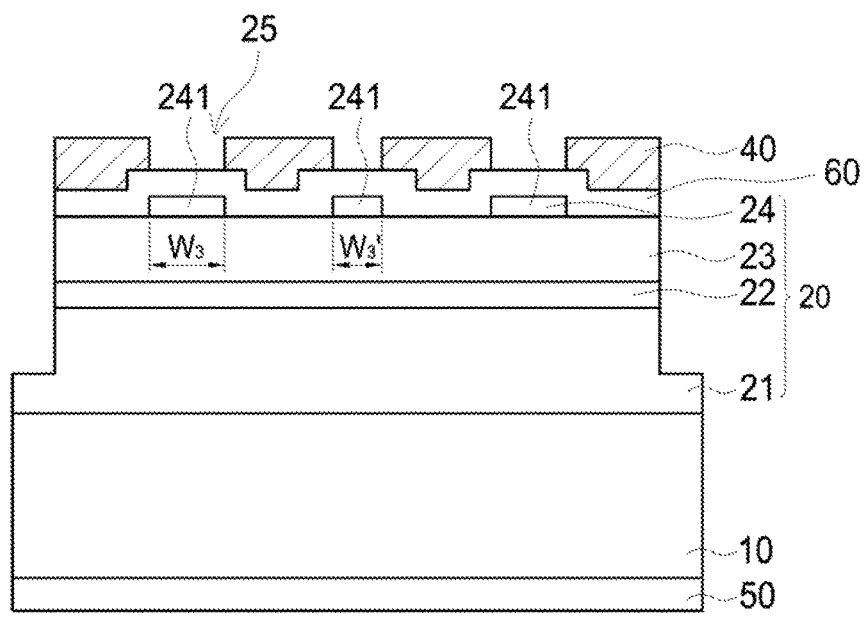
FIG. 21B is a cross-sectional diagram along an A-A' line showing the eleventh embodiment of the light-emitting device shown in FIG. 21A.

FIG. 21A is a top view of the eleventh embodiment of the light-emitting device in accordance with the present disclosure; FIG. 21B is a cross-sectional diagram along an A-A' line showing the light-emitting device shown in FIG. 21A. The same reference number given or appeared in different paragraphs or figures along the specification should has the same or equivalent structure, material, material composition, the manufacturing process thereof while it is once defined anywhere of the disclosure except it is specifically described differently. The light-emitting device in accordance with the eleventh embodiment of the present disclosure comprises substantially the same structure as the tenth embodiment, and the difference is that the width $w_{3'}$ of at least one of the contact regions 241 is different from the width $w_3$ of other contact regions so as to have multiple different lasing threshold currents $I_{th}$. In the present embodiment, the widths $w_{3'}$ of the contact regions 241 in the middle column are smaller than the widths $w_3$ of the other contact regions 241 as shown in FIG. 21B. The difference between the width of one of the contact regions 241 in the middle column and the width of one of the other contact regions 241 in other two columns is not less than 3 μm, and preferably, larger than 8 μm, and preferably less than 40 μm. The second openings 25 aligning with the contact regions 241 in the middle column is smaller than the other second openings 25 as shown in FIG. 21A. The ratio of the width of the contact regions 241 to the second maximum width $w_2$ of the corresponding second opening 25 is between 0.1 and 3, and preferably, is between 0.5 and 1.1, and more preferably between 0.6 and 0.8. The light-emitting device comprises multiple different lasing threshold currents $I_{th}$. Each of the lasing threshold currents $I_{th}$ is for generating a coherent light from one of the radiation emitting regions I. Specifically, because the widths $w_{3'}$ of the contact regions 241 are smaller than the widths $w_3$ of the other contact regions 241, the lasing threshold current $I_{th}$ for a emitting coherent light from one of the radiation emitting regions I in the middle column are smaller than the lasing threshold current $I_{th}$ for emitting a coherent light from one of the radiation emitting regions I in the other two columns. As a result, in the present embodiment, with an forward current greater than the lasing threshold current $I_{th}$ for emitting a coherent light from one of the radiation emitting regions I in the middle column and less than the lasing threshold current $I_{th}$ for emitting a coherent light from one of the radiation emitting regions I in the other two columns, the radiations emitted from the radiation emitting regions I in the middle column are coherent light each having a far-field angle of less than 15 degrees while the radiations emitted from the other radiation emitting regions I are incoherent lights each having a far-field angle of greater than 60 degrees. Therefore, the light-emitting device is suitable for applications required both long-distance and short-distance properties such as security cameras. The arrangement of the contact regions 241 having different widths are not limited to the present embodiment. For example, the contact regions 241 having a width smaller that of the others can be arranged in the first column. Or, the contact region with a smaller width and the contact region with a larger width can be arranged alternately in a row and/or in a column so as to be arranged in a staggered arrangement.

Figure 22:
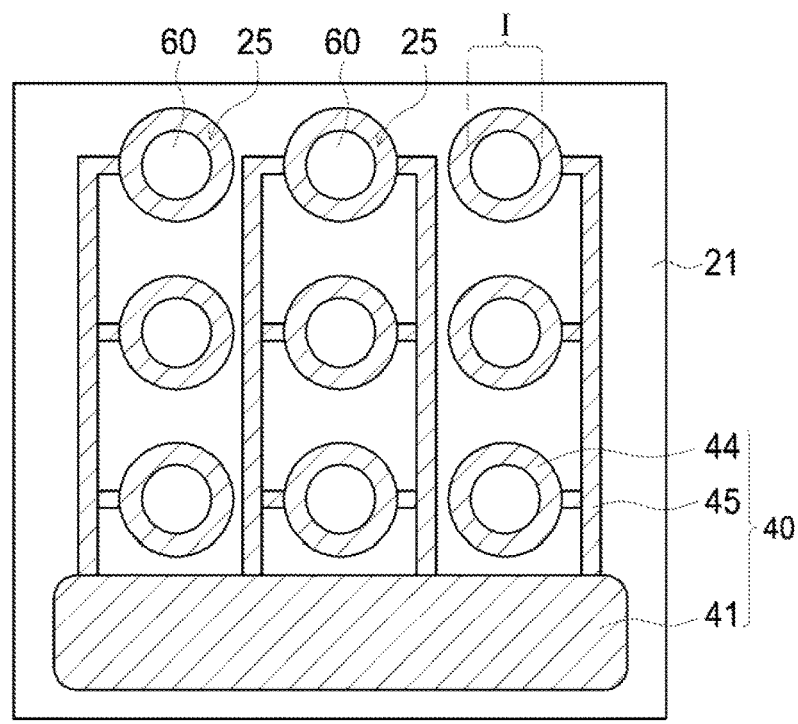
FIG. 22 is a top view of the twelfth embodiment of the light-emitting device in accordance with the present disclosure.

FIG. 22 is a top view of the twelfth embodiment of the light-emitting device in accordance with the present disclosure. The same reference number given or appeared in different paragraphs or figures along the specification should has the same or equivalent structure, material, material composition, the manufacturing process thereof while it is once defined anywhere of the disclosure except it is specifically described differently. The light-emitting device in accordance with the twelfth embodiment of the present disclosure comprises substantially the same structure as the eleventh embodiment, and the difference is that the light-emitting device comprises multiple lasing threshold currents $I_{th}$ substantially the same with one another. Each of the lasing threshold currents $I_{th}$ is for generating a coherent light from one of the radiation emitting regions I. By using a different layout of the first electrode 40 to control different amounts of current injecting into different contact regions 241, one of the contact regions 241 draws more current compared to the current drawn to the other contact regions 241 when a current flows into the light-emitting device. Specifically, in the present embodiment, each width of the contact regions 241 in the middle column is substantially the same as each width of the other contact regions 241. Each second opening 25 aligning with the contact region 241 in the middle column has a width substantially the same as each width of the other second openings 25. The first electrode 40 on the conductive layer 60 has a different layout compared to the first electrode 40 as shown in FIG. 21A. Specifically, the first electrode 40 has a bonding portion 41 and multiple first extensions 44 and second extensions 45. The bonding portion 41 is for a wire to be bonded thereto. The first extension 44 each surrounds one of the second openings 25. Each of the second extensions 45 substantially perpendicularly extends from the bonding portion 41 and connects to at least three of the first extensions 44. In the present embodiment, each width of the first extension 44 is substantially the same as one another. Each width of the second extension 45 is substantially the same as one another. The first extensions 44 surrounding the second openings 25 in the middle column connect to two second extensions 45 while the first extensions 44 surrounding the second openings 25 in the other two columns connect to only one second extension 45. As a result, when driving the light-emitting device, each of the contact regions 241 in the middle column draws more current compared to the current drawn to the other contact regions 241. When the forward current passing through each contact region in the middle column reaches the lasing threshold current $I_{th}$ of the corresponding radiation emitting regions I, the forward current passing through each contact region in the other two columns is still less than the lasing threshold current $I_{th}$ of the corresponding radiation emitting regions I. As a result, the radiations emitted from the radiation emitting regions I in the middle column are coherent lights each having a far-field angle of less than 15 degrees while the radiations emitted from the other radiation emitting regions I column are incoherent lights each having a far-field angle of greater than 60 degrees. Therefore, the light-emitting device is suitable for applications requiring both long-distance and short-distance properties such as security cameras. In another embodiment, to obtain the same result, the width of one of the first extensions 44 in the middle column may be greater than the width of one of the first extensions 44 in the other two columns. In another embodiment, to obtain the same result, the width of the second extension 45 in the middle column may be greater than the width of one of the second extension 45 in the other two columns instead of comprising two second extensions 45 connected to the first extensions 44 in the middle column. The arrangement of the first extensions 44 and the second extensions 45 is not limited to the present embodiment. For example, the first extensions 44 surrounding the second openings 25 in the first column may also connect to two second extensions 45, and the width of the first extensions 44 and the width of the second extensions 45 can be changed correspondingly.

Figure 23:
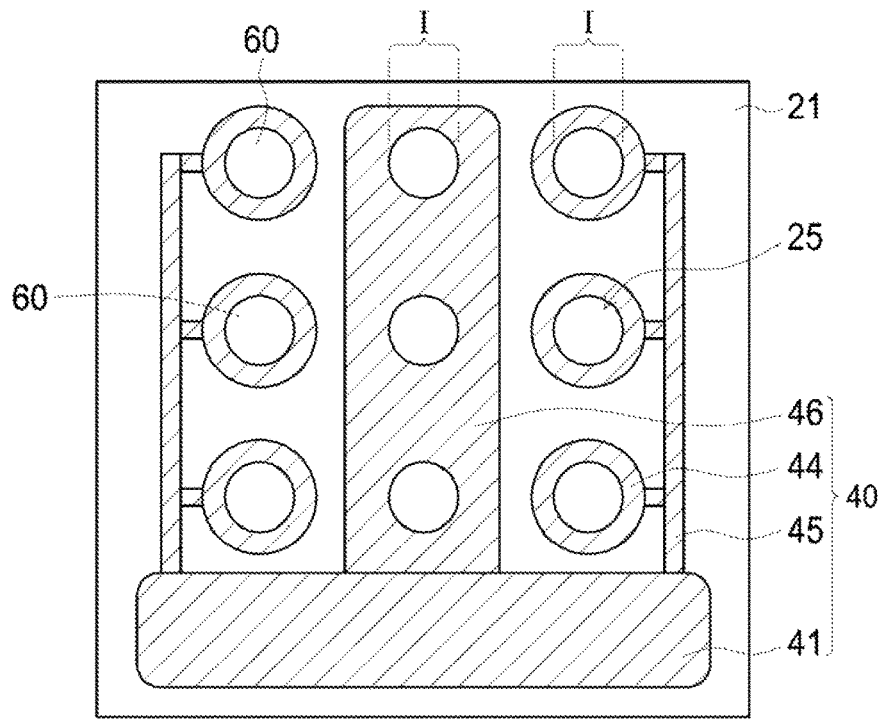
FIG. 23 is a top view of the thirteenth embodiment of the light-emitting device in accordance with the present disclosure.

FIG. 23 is a top view of the thirteenth embodiment of the light-emitting device in accordance with the present disclosure. The same reference number given or appeared in different paragraphs or figures along the specification should has the same or equivalent structure, material, material composition, the manufacturing process thereof while it is once defined anywhere of the disclosure except it is specifically described differently. The light-emitting device in accordance with the thirteenth embodiment of the present disclosure comprises substantially the same structure as the twelfth embodiment, and the difference is that the first electrode 40 has a different layout on the conductive layer 60. The first electrode 40 comprising a third extension 46 having a width wider than the width of the first extension 44 and the width of the second extension 45. As a result, the third extension 46 covers a larger area of the periphery part of the second openings 25 in the middle column compared to an area of the periphery part of the second openings 25 covered by the first extensions 44 and the second extensions 45 in the other two columns. As a result, the contact area between the conductive layer 60 and the first electrode 40 surrounding the second openings 25 in the middle column are greater than the contact area between the conductive layer 60 and the first electrode 40 surrounding the other second openings 25. Therefore, when driving the light-emitting device, each of the contact regions 241 in the middle column draws more current compared to the current drawn to the other contact regions 241. When the forward current passing through each contact region 241 in the middle column reaches the lasing threshold current $I_{th}$ of the corresponding radiation emitting regions I, the forward current passing through each contact region in the other two columns is still less than the lasing threshold current $I_{th}$ of the corresponding radiation emitting regions I. As a result, the radiations emitted from the radiation emitting regions I in the middle column are coherent lights each having a far-field angle of less than 15 degrees while the radiations emitted from the other radiation emitting regions I column are incoherent lights each having a far-field angle of greater than 60 degrees. Therefore, the light-emitting device is suitable for applications requiring both long-distance and short-distance properties such as security cameras. The layout of the first extensions 44 and the second extensions 45 is not limited to the present embodiment. For example, the first electrode 40 may cover a larger area of the periphery part of the second openings 25 in the first column instead of in the middle column.

The light-emitting stack 22 comprises an active region comprises a single heterostructure (SH), a double heterostructure (DH), or a multi-quantum well (MQW) structure. Preferably, the active region comprises a multi-quantum well (MQW) structure comprising alternate well layers and barrier layers. The band gap of each barrier layer is higher than the band gap of one of the well layers. The peak wavelength of the light emitted from the active region can be changed by adjusting the thicknesses and the material of the well layers. Preferably, the material of the well layers comprises a Group III-V semiconductor material, such as AlGaAs. The material of the barrier layers comprises a Group III-V semiconductor material, such as AlGaAs. The light-emitting stack 22 may further comprise a space layer between the active region and the first DBR stack 21 and/or between the active region and the second DBR stack 23 for adjusting the total thickness of the light-emitting stack 22 to substantially satisfy a thickness equal to n $\lambda/2$, wherein $\lambda$ is the peak wavelength of the radiation emitted from the light-emitting stack 22, and n is an positive integer. The material of the space layer comprises a Group III-V semiconductor material, such as AlGaAs.

The first DBR stack 21 and second DBR stack 23 comprise a plurality of alternating semiconductor layers of high and low indices of refraction. The material of the first DBR stack 21 and second DBR stack 23 comprise a Group III-V semiconductor material, such as $Al_xGa_{(1-x)}As/Al_yGa_{(1-y)}As$, wherein x is different from y, and the content of Al and Ga can be adjusted for reflecting a predetermined wavelength range. Each semiconductor layer has a thickness substantially equal to $\lambda/4n$, wherein $\lambda$, is peak wavelength of the radiation emitted from the light-emitting stack 22, and n is the refractive index of the layer. The first DBR stack 21 has a reflectivity of over 99% at the peak wavelength. The second DBR stack 23 has a reflectivity of over 98% at the peak wavelength. Preferably, the reflectivity of the first DBR stack 21 is higher than that of the second DBR stack 23. The pair number of the first DBR stack 21 is greater than the pair number of the second DBR stack 23, wherein a semiconductor layer of high refractive index and a semiconductor layer of low refractive index are considered as a pair. Preferably, the pair number of the first DBR stack 21 is greater than 15, and more preferably, greater than 30, and less than 80. The pair number of the second DBR stack 23 is greater than 15, and more preferably, greater than 20, and less than 80.

In the present embodiment, the substrate 10 provides a top surface for epitaxially growing the epitaxial structure 20.

The substrate 10 has a thickness thick enough for supporting the layers or the structures grown thereon. Preferably, the substrate 10 has a thickness not less than 100 μm, and preferably, not greater than 250 μm. The substrate 10 is single crystal and comprises a semiconductor material, for example, a Group III-V semiconductor material or a Group IV semiconductor material. In one embodiment, the substrate 10 comprises a Group III-V semiconductor material of n-type or p-type. In the present embodiment, the Group III-V semiconductor material comprises GaAs of n-type. The n-type dopant comprises Si.

The permanent substrate 80 is electrically conductive for conducting a current flowing between the first electrode 40 and the second electrode 50. The permanent substrate 80 has a thickness thick enough for supporting the layers or structures thereon, for example, greater than 100 μm. The substrate comprises a conductive material comprising Si, Ge, Cu, Mo, MoW, AlN, ZnO or CuW. Preferably, the permanent substrate 80 comprises Si or CuW.

The first electrode 40 and the second electrode 50 are for electrically connected to an external power source and for conducting a current therebetween. The material of the first electrode 40 and the second electrode 50 comprise transparent conductive material or metal material, wherein the transparent conductive material comprises transparent conductive oxide, and wherein the metal material comprises Au, Pt, GeAuNi, Ti, BeAu, GeAu, Al, or ZnAu, Ni.

The first electrode 40 forms a low resistance contact or an ohmic contact with the second DBR stack 23 through the contact layer 24 wherein the resistance between first electrode 40 and the second DBR stack 23 is lower than $10^{-2}$ ohm-cm. The conductivity type of the contact layer 24 is the same as that of the second DBR stack 23. In one embodiment, the contact layer 24 is p-type and has a high p-type impurity concentration, such as greater than $10^{18}/cm^3$, and preferably, greater than $10^{19}/cm^3$, and more preferably, between $1\times10^{19}/cm^3$ and $5\times10^{22}/cm^3$ both inclusive. The material of the contact layer comprises a Group III-V semiconductor material, such as GaAs, AlGaAs.

The bonding layer 100 and/or the temporary bonding payer 80 comprises transparent conducive oxide, metal material, insulating oxide, or polymer. The transparent conducive oxide comprises indium tin oxide (ITO), indium oxide (InO), tin oxide (SnO), cadmium tin oxide (CTO), antimony tin oxide (ATO), aluminium zinc oxide (AZO), zinc tin oxide (ZTO), gallium doped zinc oxide (GZO), tungsten doped indium oxide (IWO), zinc oxide (ZnO), or indium zinc oxide (IZO). The metal material comprises In, Sn, Au, Ti, Ni, Pt, W or the alloys thereof. The insulating oxide comprises aluminum oxide ($AlO_x$), silicon oxide ($SiO_x$), or silicon oxynitride ($SiO_xN_y$). The polymer comprises epoxy, polyimide, perfluorocyclobutane, benzocyclobutene (BCB) or silicone. The bonding layer has a thickness between 400 nm and 5000 nm.

The method of performing epitaxial growth comprises, but is not limited to metal-organic chemical vapor deposition (MOCVD), hydride vapor phase epitaxy (HVPE), molecular beam epitaxy (MBE), or liquid-phase epitaxy (LPE).

In accordance with a further embodiment of the present disclosure, the structures in the embodiments of the present disclosure can be combined or changed. For example, the light-emitting device as shown in FIGS. 1A and 1B comprises the passivation layer.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A light-emitting device comprising:
   a substrate;
   multiple radiation emitting regions arranged on the substrate, and comprising:
   a first radiation emitting region emitting a coherent light when the light-emitting device is driven by a first current; and
   a second radiation emitting region capable of emitting coherent light and emitting an incoherent light when the light-emitting device is driven by the first current; and
   a contact layer with multiple discrete contact regions;
   wherein each of the first radiation emitting region and the second emitting region comprises a first DBR stack, a light-emitting structure, and a second DBR stack; and
   wherein the multiple discrete contact regions has a first contact region on the second DBR stack of the first radiation emitting region and a second contact region on the second DBR stack of the second radiation emitting region.

2. The light-emitting device of claim 1, wherein the coherent light emitted from the first radiation emitting region has a far-field angle of less than 15 degrees.

3. The light-emitting device of claim 1, wherein the incoherent light emitted from the second radiation emitting regions has a far-field angle of greater than 60 degrees.

4. The light-emitting device of claim 1, further comprising a surface, and the first radiation emitting region being closer to the middle of the surface than the second radiation emitting region to the middle of the surface.

5. The light-emitting device of claim 1, wherein the multiple radiation emitting regions are arranged in a staggered arrangement.

6. The light-emitting device of claim 1, wherein the second radiation emitting region emits a coherent light when the light-emitting device is driven by a second current larger than the first current.

7. The light-emitting device of claim 1, wherein the first radiation emitting region comprises a first lasing threshold current and the second radiation emitting region comprises a second lasing threshold current different from the first lasing threshold current.

8. The light-emitting device of claim 1, wherein the light-emitting device is devoid of a highly resistive structure or undercut aperture in the second DBR stack.

9. The light-emitting device of claim 1, wherein the first radiation emitting region comprises a first width and the second radiation emitting region comprises a second width different from the first width from a cross section view of the light-emitting device.

10. The light-emitting device of claim 1, wherein the multiple discrete contact regions are arranged in a two-dimensional array.

11. The light-emitting device of claim 1, further comprising a conductive layer covering the contact layer.

12. The light-emitting device of claim 1, wherein the second DBR stacks of the first radiation emitting region and the second radiation emitting region are connected to each other from a cross section view of the light-emitting device.

13. The light-emitting device of claim 1, wherein, from a cross section view of the light-emitting device, the first contact region has a first width and the second contact region has a second width different from the first width.

14. The light-emitting device of claim 13, wherein the first contact region substantially aligns with the first radiation emitting region and the second contact region substantially aligns with the second radiation emitting region.

15. The light-emitting device of claim 1, further comprising an electrode on the contact layer, wherein a first area of the electrode surrounding the first radiation emitting region is different from a second area of the electrode surrounding the second radiation emitting region.

16. The light-emitting device of claim 1, wherein the multiple radiation emitting regions are arranged on the substrate in a two-dimensional array from a top view of the light-emitting device.

17. A light-emitting device comprising:
a substrate;
multiple radiation emitting regions arranged on the substrate, and comprising:
a first radiation emitting region emitting a coherent light when the light-emitting device is driven by a first current; and
a second radiation emitting region capable of emitting coherent light and emitting an incoherent light when the light-emitting device is driven by the first current; and
an electrode on the multiple radiation emitting regions and comprising multiple first extensions,
wherein one of the multiple first extensions surrounds the first radiation emitting region, and one of the multiple first extensions surrounds the second radiation emitting region; and
wherein each of the first radiation emitting region and the second radiation emitting region comprises a first DBR stack, a light-emitting structure, and a second DBR stack.

18. The light-emitting device of claim 17, further comprising multiple second extensions connected to the multiple first extensions, wherein a number of the second extensions connected to the one of the multiple first extensions surrounding the first radiation emitting region is different from that connected to the one of the multiple first extensions surrounding the second radiation emitting region.

19. The light-emitting device of claim 17, wherein the one of the multiple first extensions surrounding the first radiation emitting region has a width different from that of the one of the multiple first extensions surrounding the second radiation emitting region.

20. The light-emitting device of claim 17, further comprising multiple second extensions connected to the multiple first extensions, wherein one of the multiple second extensions connected to the one of the multiple first extensions surrounding the first radiation emitting region has a width different from that of one of the multiple second extensions connected to the one of the multiple first extensions surrounding the second radiation emitting region.

* * * * *